US012454767B2

(12) United States Patent
Mihara et al.

(10) Patent No.: US 12,454,767 B2
(45) Date of Patent: Oct. 28, 2025

(54) SINGLE CRYSTAL MANUFACTURING APPARATUS

(71) Applicant: SHIN-ETSU HANDOTAI CO., LTD., Tokyo (JP)

(72) Inventors: Keisuke Mihara, Nishigo-mura (JP); Kazuya Yanase, Nishigo-mura (JP); Nobuaki Mitamura, Nishigo-mura (JP); Kiyotaka Takano, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 241 days.

(21) Appl. No.: 18/037,802

(22) PCT Filed: Nov. 1, 2021

(86) PCT No.: PCT/JP2021/040259

§ 371 (c)(1),
(2) Date: May 19, 2023

(87) PCT Pub. No.: WO2022/123957

PCT Pub. Date: Jun. 16, 2022

(65) Prior Publication Data

US 2024/0003046 A1 Jan. 4, 2024

(30) Foreign Application Priority Data

Dec. 10, 2020 (JP) ................................ 2020-205263
Dec. 10, 2020 (JP) ................................ 2020-205275

(51) Int. Cl.

| | |
|---|---|
| ***C30B 15/14*** | (2006.01) |
| ***C30B 15/10*** | (2006.01) |
| ***C30B 29/06*** | (2006.01) |

(52) U.S. Cl.

CPC ............. *C30B 15/14* (2013.01); *C30B 15/10* (2013.01); *C30B 29/06* (2013.01)

(58) Field of Classification Search

CPC ......... C30B 15/10; C30B 15/14; C30B 29/06; Y10T 117/1068

See application file for complete search history.

(56) References Cited

U.S. PATENT DOCUMENTS 6,858,076 B1 * 2/2005 Nakajima ............... C30B 29/06 117/14
8,840,721 B2 9/2014 Narushima et al.

(Continued)

FOREIGN PATENT DOCUMENTS

DE 11 2008 003 609 T5 2/2011
DE 11 2019 006 883 T5 11/2021

(Continued)

OTHER PUBLICATIONS

Jan. 24, 2025 Office Action issued in Korean Patent Application No. 10-2023-7018918.

(Continued)

*Primary Examiner* — Robert M Kunemund
(74) *Attorney, Agent, or Firm* — Oliff PLC

(57) ABSTRACT

A single crystal manufacturing including: main chamber; pulling chamber; thermal shield member provided so as to face a silicon melt; rectifying cylinder provided on the thermal shield member so as to enclose the silicon single crystal being pulled up; cooling cylinder provided so as to encircle the silicon single crystal being pulled up and including an extending portion extending toward the silicon melt; and cooling auxiliary cylinder fitted to inside of the cooling cylinder. The extending portion of the cooling cylinder includes a bottom surface facing the silicon melt. The cooling auxiliary cylinder includes at least a first portion surrounding the bottom surface of the cooling cylinder and a second portion surrounding an upper end portion of the rectifying cylinder. This enables provision of the apparatus (Continued)

capable of manufacturing a single crystal with a carbon concentration lower than that according to the conventional technologies.

11 Claims, 9 Drawing Sheets

(56) References Cited

U.S. PATENT DOCUMENTS

| | | | |
|---|---|---|---|
| 10,266,964 B2 | 4/2019 | Miyao et al. | |
| 2006/0060133 A1* | 3/2006 | Nakashima | C30B 15/02 117/217 |
| 2008/0115720 A1* | 5/2008 | Saishoji | C30B 15/14 438/502 |
| 2009/0229512 A1* | 9/2009 | Kamogawa | C30B 35/00 117/217 |
| 2010/0258050 A1 | 10/2010 | Hoshi et al. | |
| 2011/0056427 A1 | 3/2011 | Soeta et al. | |
| 2012/0000416 A1* | 1/2012 | Wang | C30B 15/14 165/185 |
| 2017/0107639 A1* | 4/2017 | Basak | C30B 15/206 |
| 2020/0027732 A1 | 1/2020 | Ogawa et al. | |
| 2022/0136130 A1 | 5/2022 | Kobayashi et al. | |

FOREIGN PATENT DOCUMENTS

| | | |
|---|---|---|
| JP | 2008-285351 A | 11/2008 |
| JP | 2010-013300 A | 1/2010 |
| JP | 2010-143776 A | 7/2010 |
| JP | 2010-184839 A | 8/2010 |
| JP | 2011-057467 A | 3/2011 |
| JP | 2011-105537 A | 6/2011 |
| JP | 2012-201564 A | 10/2012 |
| JP | 2013-256406 A | 12/2013 |
| JP | 2016-113198 A | 6/2016 |
| JP | 2016-210637 A | 12/2016 |
| JP | 2018-140882 A | 9/2018 |
| JP | 2020-152612 A | 9/2020 |
| KR | 101829319 B1 | 2/2018 |

OTHER PUBLICATIONS

Dec. 12, 2023 Office Action issued in Japanese Patent Application No. 2020-205275.
Dec. 21, 2021 International Search Report issued in International Patent Application No. PCT/JP2021/040259.
Jun. 13, 2023 International Preliminary Report on Patentability issued in International Patent Application No. PCT/JP2021/040259.
Nov. 26, 2024 Office Action issued in German Patent Application No. 11 2021 005 336.1.

* cited by examiner

[FIG. 1]
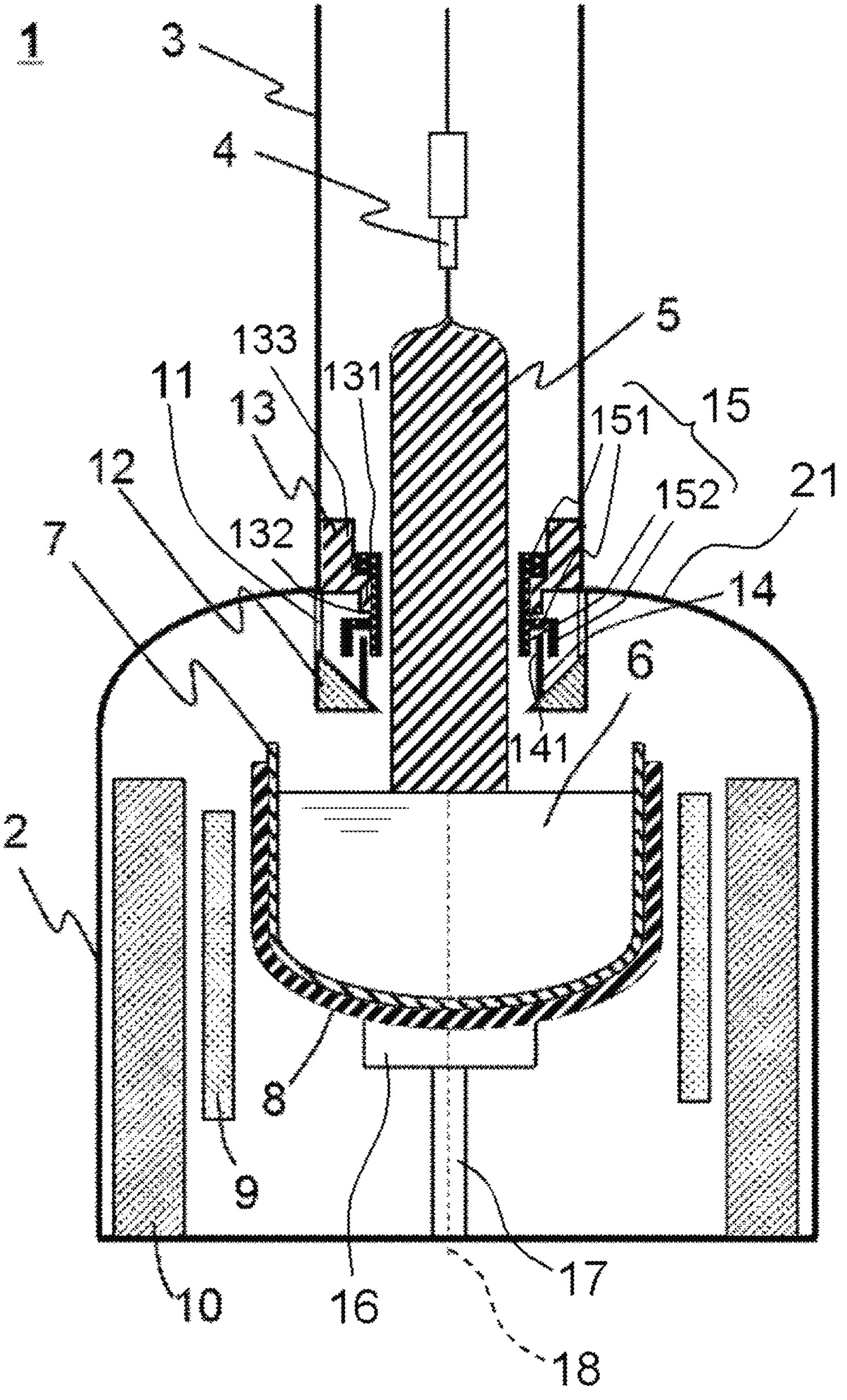

[FIG. 2]
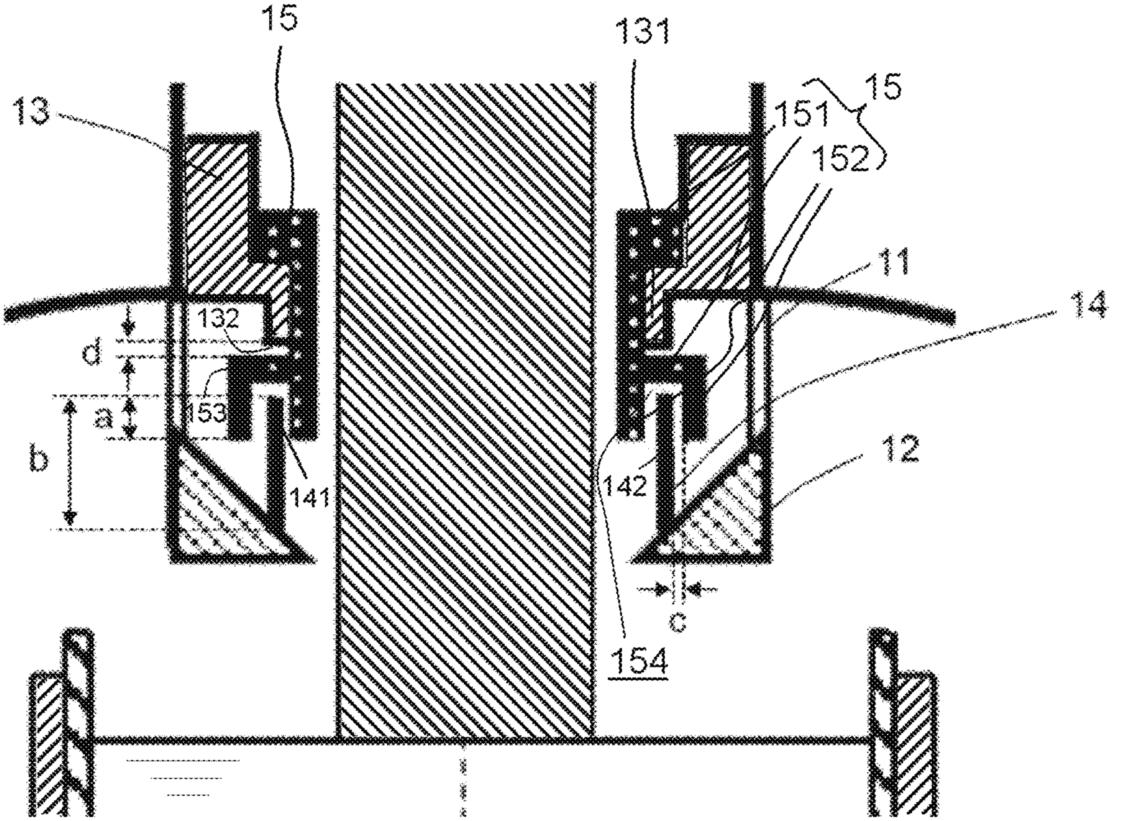
[FIG. 3]
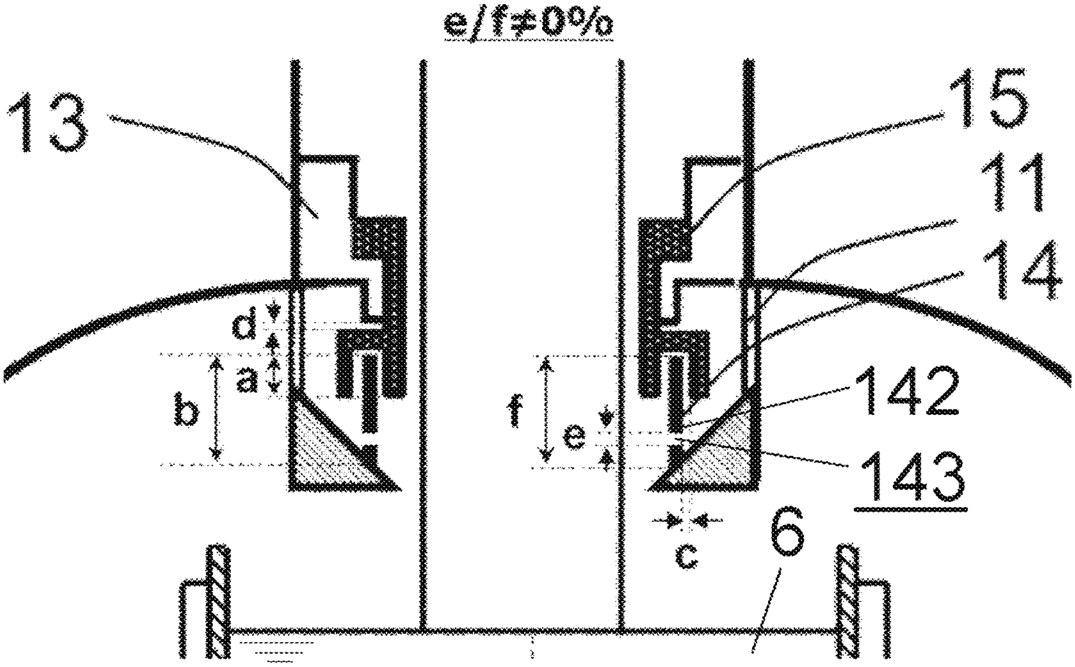

[FIG. 4]
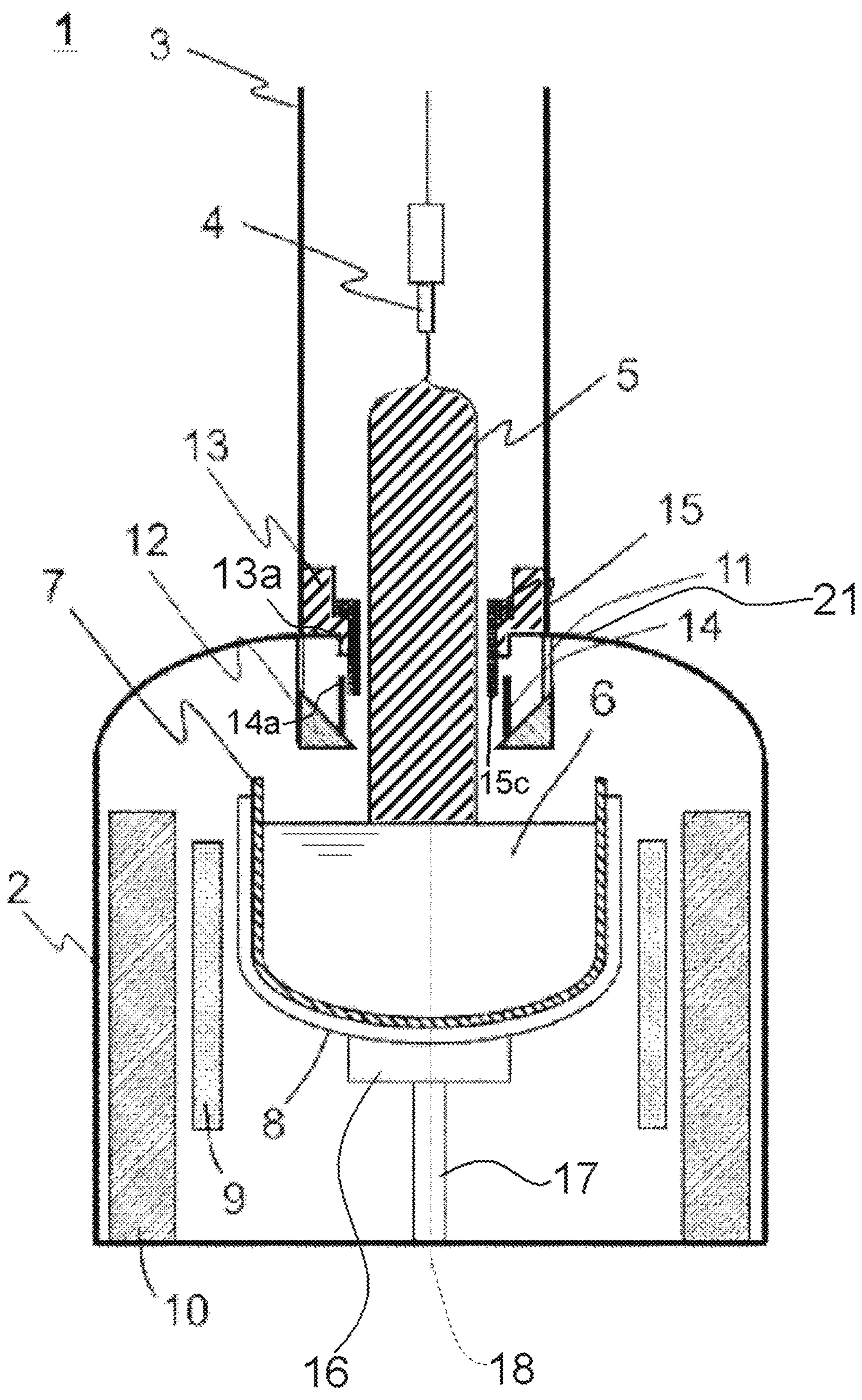

[FIG. 5]
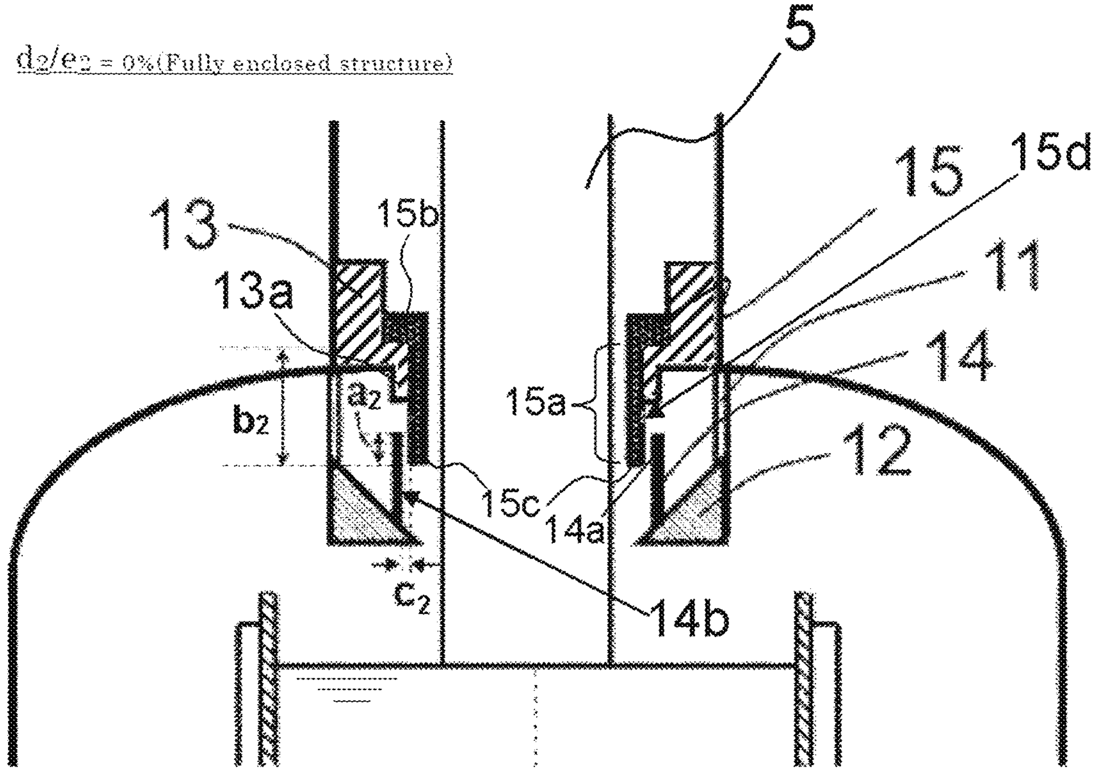
[FIG. 6]
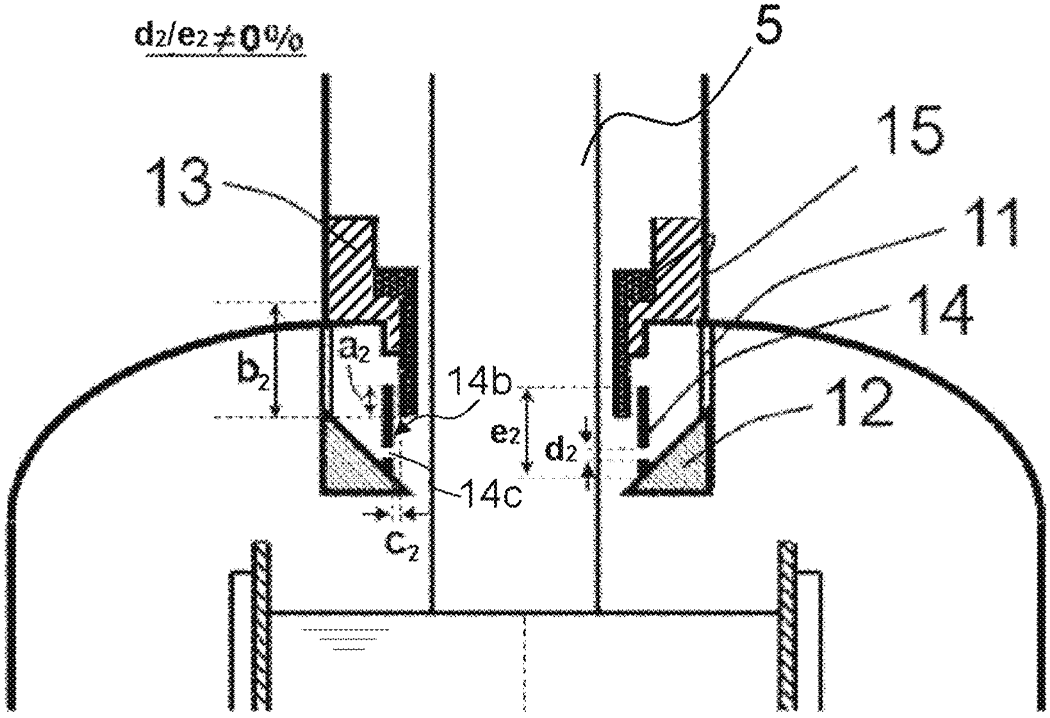

[FIG. 7]
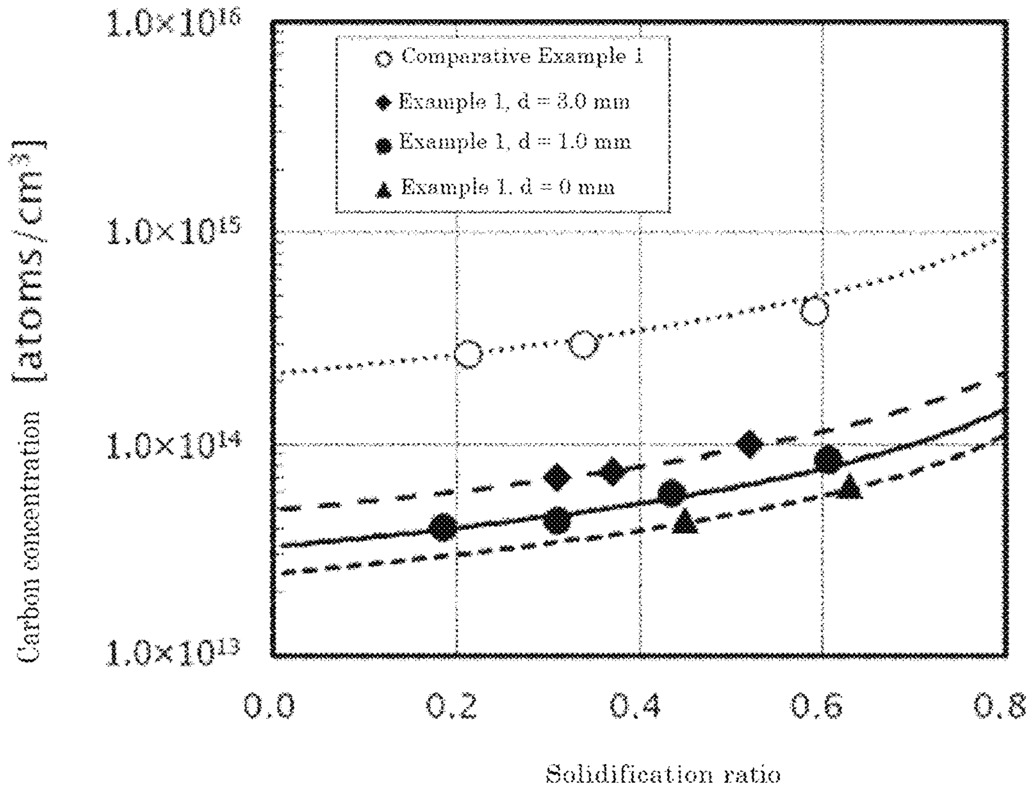
[FIG. 8]
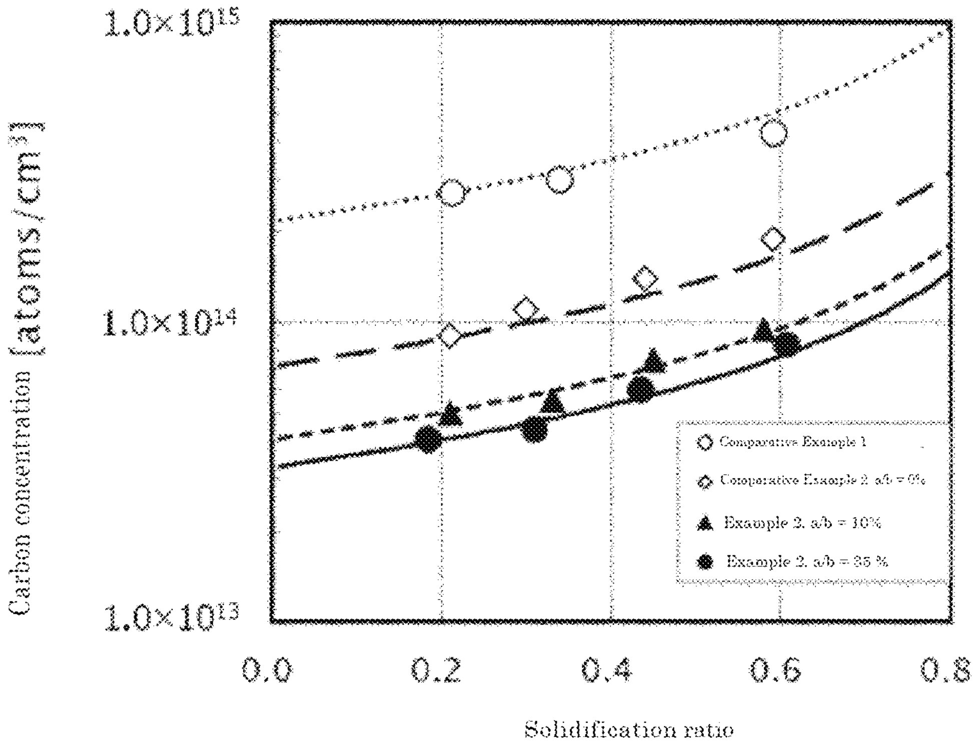

[FIG. 9]
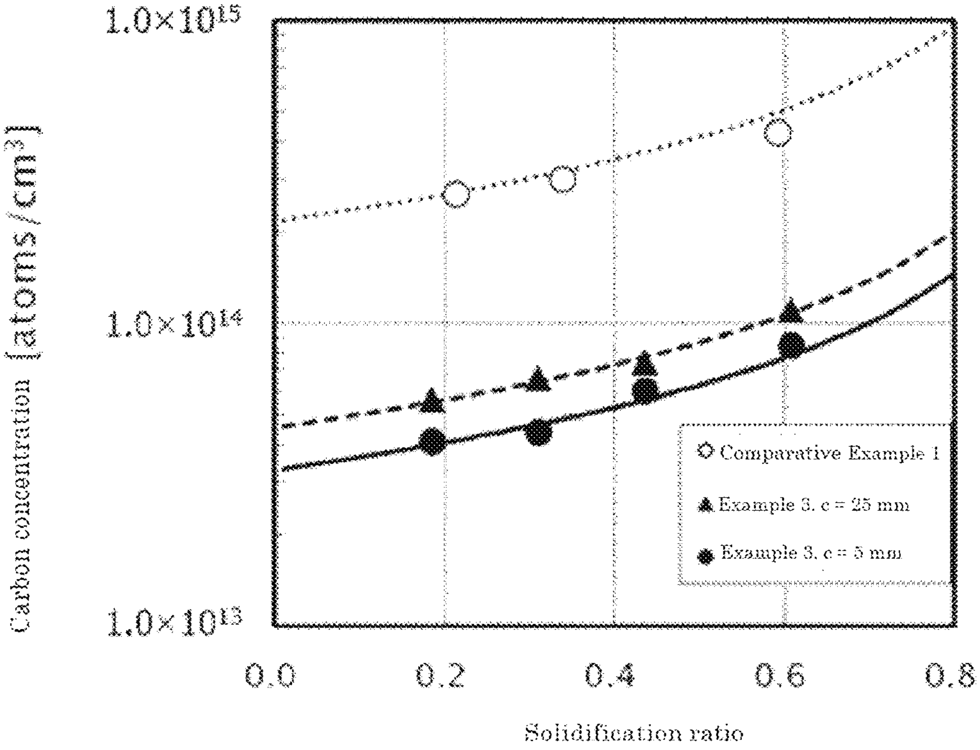
[FIG. 10]
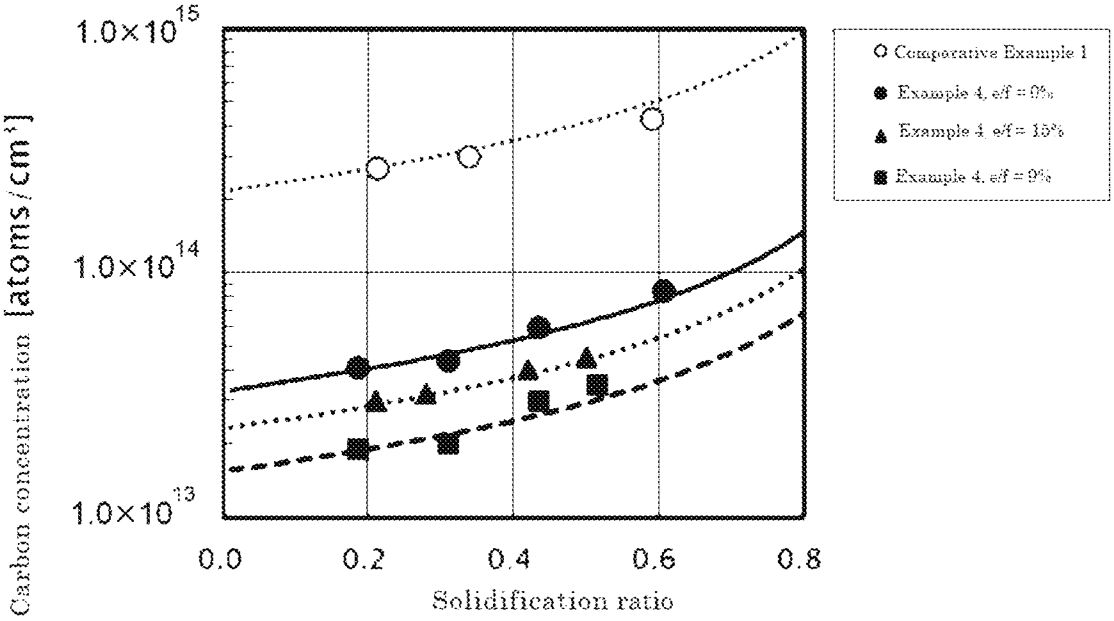

[FIG. 11]
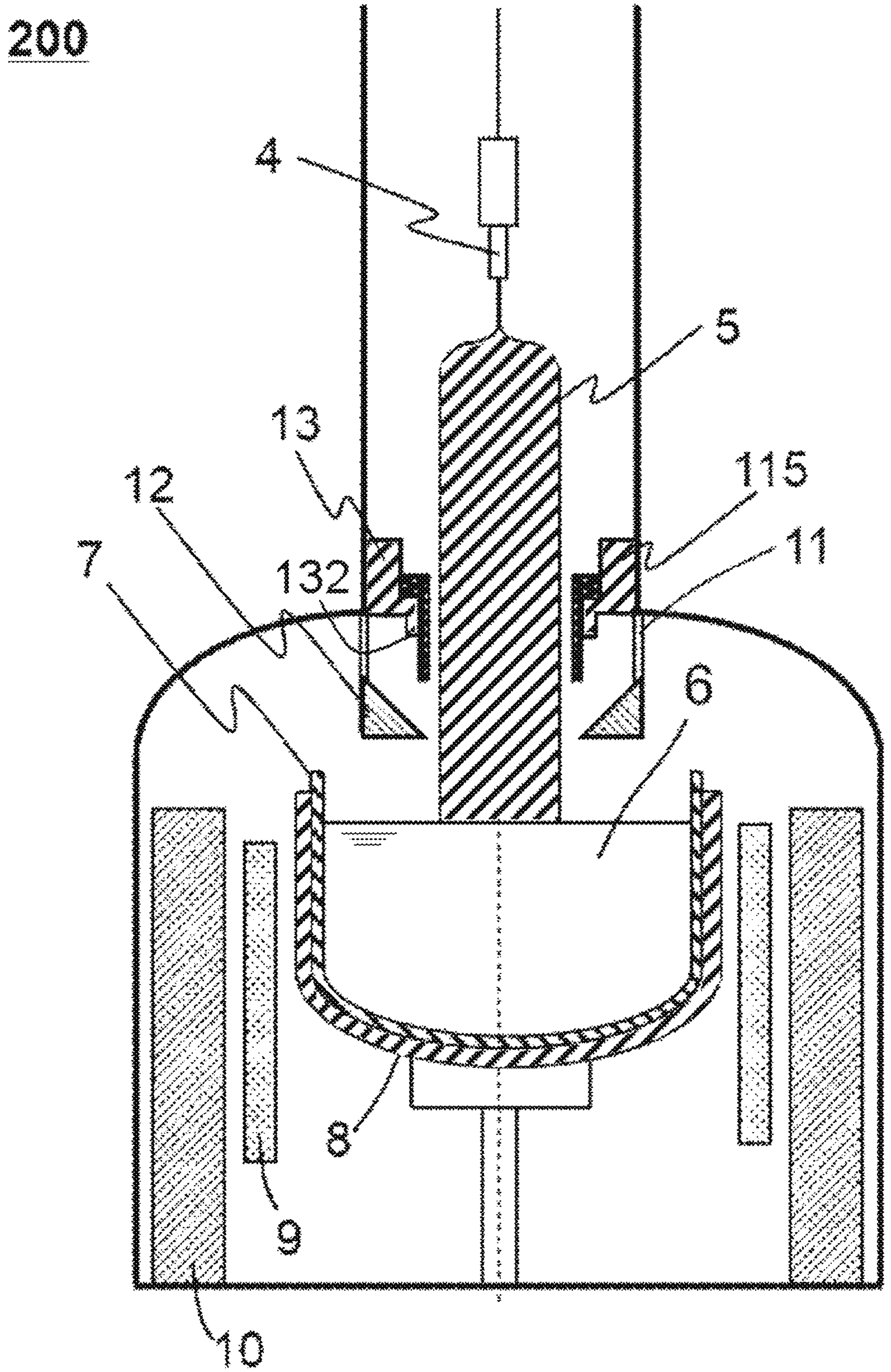

[FIG. 12]
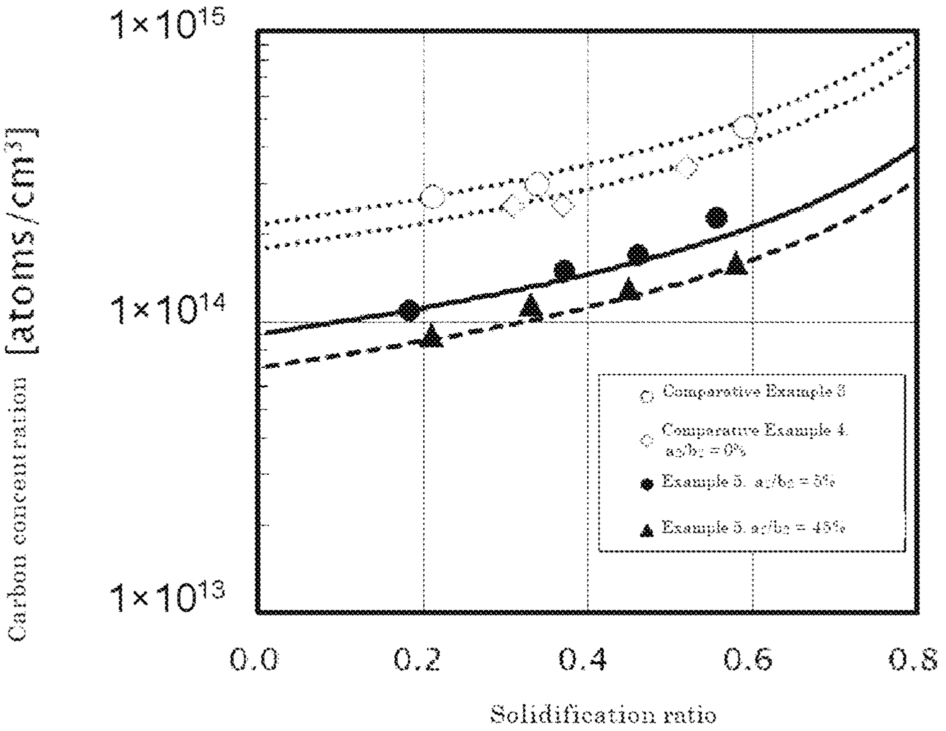
[FIG. 13]
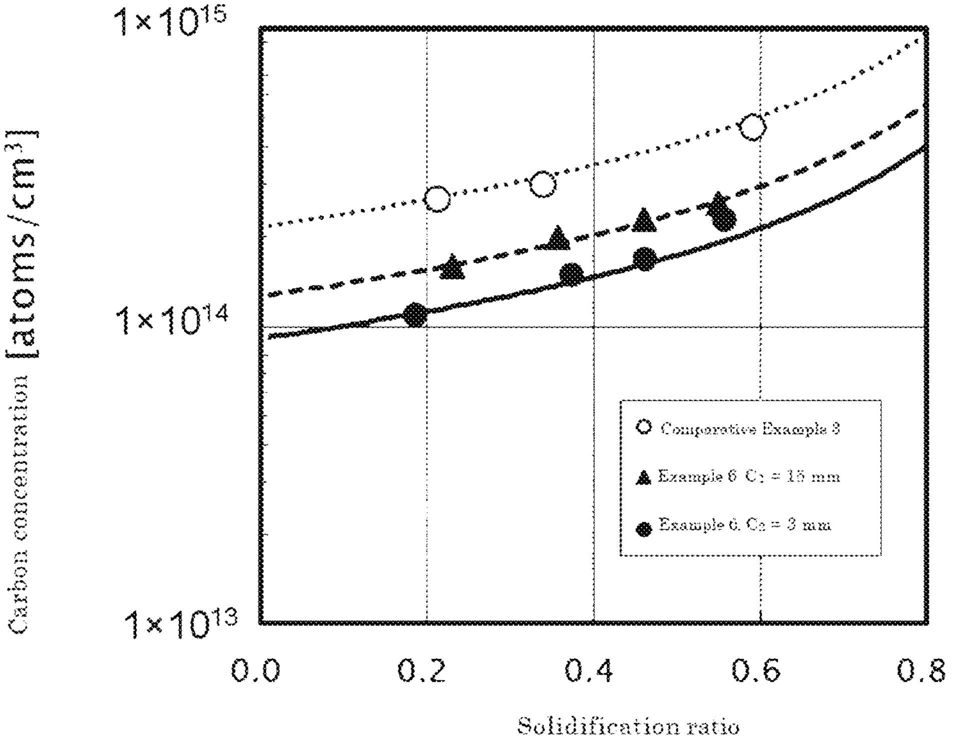

[FIG. 14]
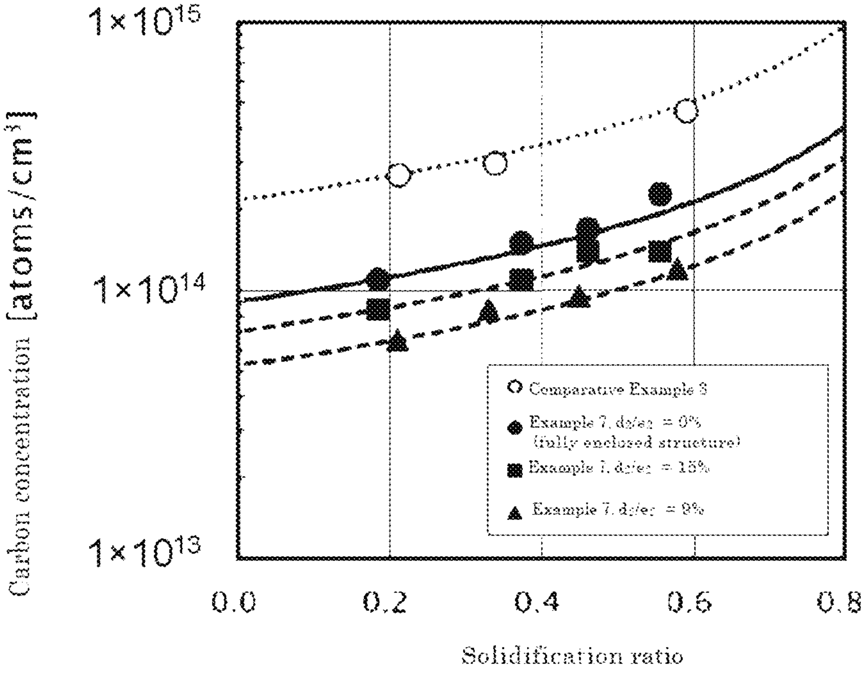

SINGLE CRYSTAL MANUFACTURING APPARATUS

TECHNICAL FIELD

The present invention relates to a single crystal manufacturing apparatus.

BACKGROUND ART

A radio frequency (RF) (high-frequency) device for communication such as a mobile phone has been used.

In an RF device using a silicon single crystal wafer, low substrate resistivity causes greater loss due to high conductivity. Thus, used is a wafer with high resistivity of 1000 Ωcm or more, that is, a wafer in which a concentration of dopant, such as a boron and a phosphorus related to resistivity is extremely low.

There is a case where a wafer in which a thin oxide film and a thin silicon layer are formed in a silicon substrate surface layer portion, which is called a silicon on insulator (SOI), is used. Also in this case, high resistivity has been desired.

Additionally, a high-withstand-voltage wafer with relatively high resistivity has been desired also for a power device, and a silicon single crystal wafer with an extremely low carbon concentration has been requested for an insulated gate bipolar transistor (IGBT) or the like to obtain favorable characteristics. That is, in the latest semiconductor devices, it is an essential issue to reduce not only impurities such as heavy metal, but also impurities such as dopant and carbon that is a light element.

Carbon contaminated into a silicon single crystal include two types. The one is derived from introduction of carbon from a raw material, and the other is derived from a reaction in a furnace during a crystal manufacturing process. A technology in which an attempt is made to reduce a carbon concentration for each introduction process has been reported.

Regarding the introduction from the raw material, there are organic substances that carbonize without turning into gas at high temperatures among organic substances attached to the surface of raw material silicon, and there is an issue that introduction of these carbonized organic substances into a crystal increases a carbon concentration in the crystal.

Examples of a method to resolve this issue include a method in which single crystal growing by a Czochralski (CZ) method is performed by using a polycrystalline raw material stored in a polyethylene storage bag that is less susceptible to contamination by organic substances including paraffinic hydrocarbon, which is described in Patent Literature 1, and a method in which organic substances on the surface of the polycrystalline is identified, quantitative analysis is performed, the raw material is sorted, and then single crystal growing is performed by using the CZ method, which is described in Patent Literature 2.

On the other hand, regarding the contamination of carbon due to the crystal manufacturing process, there is an issue that carbon-containing gas containing carbon is generated in the furnace by reaction between the carbon material in a furnace of a pulling machine and silicon monoxide (SiO) that evaporates from a silicon melt during crystal growing, and the carbon-containing gas is mixed into the melt, whereby the carbon concentration increases.

Examples of a method to resolve this issue include a method in which a cylindrical rectifying member is mounted above a graphite crucible to prevent back-flow of the carbon-containing gas into the melt side, which is described in Patent Literature 3. In addition, other examples of the method for performing single crystal growing while mounting the rectifying member include a method in which a quartz rectifying cylinder and a carbon rectifying cylinder are mounted above the crucible, which is described in Patent Literature 4, and a method of in which only the quartz rectifying cylinder is mounted above the crucible, which is described in Patent Literature 5.

Execution of single crystal growing by using the above-mentioned rectifying member can increase linear velocity of inert gas flowing from immediately above the silicon raw material melt in a direction toward an upper end of the quartz crucible, can thereby prevent the carbon-containing gas generated by reaction between the carbon member in the furnace and SiO that evaporates from the silicon melt from back-flowing into the raw material melt side, and can consequently grow a single crystal with a carbon concentration that is lower than that in a case where there is no rectifying member.

However, only increasing the linear velocity of inert gas by mounting of the above-mentioned rectifying member cannot reduce an amount of the carbon-containing gas generated by reaction between the carbon member in the furnace of the pulling machine and SiO that evaporates from the silicon melt, and thus there is a limit on an low-carbon effect that is obtained by mounting of only the above-mentioned rectifying member. For this reason, inability to manufacture a product with a lower carbon concentration has become an issue.

CITATION LIST

Patent Literature

Patent Document 1: JP 2016-113198 A
Patent Document 2: JP 2016-210637 A
Patent Document 3: JP 2012-201564 A
Patent Document 4: JP 2010-143776 A
Patent Document 5: JP 2010-184839 A

SUMMARY OF INVENTION

Technical Problem

The present invention has been made to solve the above-mentioned problems, and aims to provide an apparatus capable of manufacturing a single crystal with a carbon concentration lower than that according to the conventional technologies.

Solution to Problem

To solve the above-mentioned problems, in a first embodiment of the present invention, a single crystal manufacturing apparatus for growing a single crystal by using a Czochralski method is provided, the apparatus comprising:

a main chamber comprising a ceiling portion, and housing a crucible for containing a silicon melt;

a pulling chamber provided continuously at an upper portion of the ceiling portion of the main chamber via a gate valve, and configured to contain a silicon single crystal to be pulled up from the silicon melt;

a thermal shield member provided so as to face the silicon melt contained in the crucible;

a rectifying cylinder provided on the thermal shield member so as to enclose the silicon single crystal being pulled up;

a cooling cylinder provided so as to encircle the silicon single crystal being pulled up, comprising an extending portion extending from the ceiling portion of the main chamber toward the silicon melt, and configured to be forcibly cooled by a cooling medium; and a cooling auxiliary cylinder fitted to inside of the cooling cylinder, wherein the extending portion of the cooling cylinder includes a bottom surface facing the silicon melt, and wherein the cooling auxiliary cylinder includes at least a first portion surrounding the bottom surface of the cooling cylinder and a second portion surrounding an upper end portion of the rectifying cylinder.

With use of the inventive single crystal manufacturing apparatus according to the first embodiment, it is possible to decrease a temperature of a space around the cooling auxiliary cylinder, and to prevent generation of the carbon-containing gas by reaction between the carbon member in the furnace of the single crystal manufacturing apparatus and SiO that evaporates from the silicon melt. In addition, the rectifying cylinder is provided on the thermal shield member, and the second portion of the cooling auxiliary cylinder has a structure of surrounding the upper end portion of the rectifying cylinder, whereby it is also possible to prevent diffusion of the carbon-containing gas generated by the reaction into the silicon melt side. As a result of combination of these effects, it is possible to effectively manufacture the single crystal with a carbon concentration that is lower than that according to the conventional technologies.

The rectifying cylinder is preferably made of synthetic quartz.

With use of the rectifying cylinder made of synthetic quartz, it is possible to manufacture the single crystal with a lower carbon concentration.

The cooling auxiliary cylinder preferably includes at least one selected from the group consisting of a graphite member, a carbon composite member, stainless steel, molybdenum, and tungsten.

The first portion of the cooling auxiliary cylinder preferably has a structure of covering the bottom surface of the cooling cylinder, and a gap between the first portion of the cooling auxiliary cylinder and the bottom surface of the cooling cylinder is preferably 1.0 mm or less.

With use of such a cooling auxiliary cylinder, it is possible to manufacture the single crystal with a lower carbon concentration more efficiently.

The second portion of the cooling auxiliary cylinder preferably includes a groove portion covering a region having an area of 10% or more and 35% or less of a whole area of a side surface of the rectifying cylinder.

With use of such a structure, it is possible to certainly obtain an effect of making the carbon-containing gas hard to back-flow into the silicon melt side, the carbon-containing gas being present in a region immediately above the silicon melt.

In this case, a clearance between each of side surfaces of the upper end portion of the rectifying cylinder and a side surface of the groove portion of the second portion of the cooling auxiliary cylinder is more preferably 5 mm or more and 25 mm or less.

With use of such a structure, it is possible to more certainly prevent the carbon-containing gas to back-flow into the silicon melt side.

The rectifying cylinder preferably includes an opening in a side surface thereof, and the opening of the rectifying cylinder is preferably formed at such a position as that a height of an upper end of the opening of the rectifying cylinder is 35% or less of a whole height of the rectifying cylinder.

With use of such a rectifying cylinder having the opening in the side surface thereof, it is possible to obtain an effect of making the carbon-containing gas harder to back-flow into the raw material melt side.

Furthermore, a second embodiment of the present invention provides a single crystal manufacturing apparatus for growing a single crystal by using a Czochralski method, the apparatus comprising:

a main chamber comprising a ceiling portion, and housing a crucible for containing a silicon melt;

a pulling chamber provided continuously at an upper portion of the ceiling portion of the main chamber via a gate valve, and configured to contain a silicon single crystal to be pulled up from the silicon melt;

a thermal shield member provided so as to face the silicon melt contained in the crucible;

a rectifying cylinder provided on the thermal shield member so as to enclose the silicon single crystal being pulled up;

a cooling cylinder provided so as to encircle the silicon single crystal being pulled up, comprising an extending portion extending from the ceiling portion of the main chamber toward the silicon melt, and configured to be forcibly cooled by a cooling medium; and a cooling auxiliary cylinder fitted to inside of the cooling cylinder, wherein an upper portion of the rectifying cylinder has a structure of surrounding a lower portion of the cooling auxiliary cylinder, the lower portion being a portion projecting downward from the cooling cylinder.

With use of the single crystal manufacturing apparatus according to the second embodiment of the present invention, it is possible to decrease a temperature of a space around the cooling auxiliary cylinder, and to prevent generation of the carbon-containing gas by reaction between the carbon member in the furnace and SiO that evaporates from the silicon melt.

In addition, even if the reaction occurs, by providing the rectifying cylinder on the thermal shield member, and adopting the structure of surrounding the lower portion of the cooling auxiliary cylinder, the lower portion being the portion projecting downward from the cooling cylinder, with the upper portion of the rectifying cylinder, diffusion of the gas containing carbon generated by the reaction into the silicon melt side can also be prevented.

Hence, as a result of combination of these effects, the single crystal manufacturing apparatus according to the second embodiment of the present invention can more effectively manufacture the single crystal with a carbon concentration lower than that according to the conventional technologies.

At this time, the rectifying cylinder is preferably made of synthetic quartz.

With use of the rectifying cylinder made of synthetic quartz, it is possible to manufacture the single crystal with a lower carbon concentration.

A material of the cooling auxiliary cylinder is preferably at least one selected from the group consisting of a graphite member, a carbon composite member, stainless steel, molybdenum, and tungsten.

With use of the single crystal manufacturing apparatus including such a cooling auxiliary cylinder, it is possible to more efficiently manufacture the single crystal with a lower carbon concentration.

The rectifying cylinder preferably has a structure of surrounding a region having an area of 5% or more of a whole area of a side surface of the portion of the cooling auxiliary cylinder projecting downward from the cooling cylinder with an upper portion of the rectifying cylinder.

With use such a structure, it is possible to obtain the effect of making the carbon-containing gas harder to back-flow into the silicon melt side.

A clearance between a side surface of the rectifying cylinder and a side surface of the portion of the cooling auxiliary cylinder, the portion projecting downward from the cooling cylinder, is more preferably 3 mm or more and less than 15 mm.

With use of such a structure, it is possible to obtain the effect of making the carbon-containing gas harder to back-flow into the silicon melt side.

Furthermore, the rectifying cylinder preferably includes an opening in a side surface thereof, and the opening of the rectifying cylinder is preferably formed at such a position as that a height of an upper end of the opening of the rectifying cylinder is 35% or less of a whole height of the rectifying cylinder.

With use of such a rectifying cylinder having the opening in the side surface thereof, it is possible to obtain the effect of making the carbon-containing gas harder to back-flow into the silicon melt side.

Advantageous Effects of Invention

As described above, the single crystal manufacturing apparatus according to the first embodiment of the present invention can effectively manufacture the single crystal with a carbon concentration that is lower than that according to the conventional technologies.

Additionally, as described above, the single crystal manufacturing apparatus according to the second embodiment of the present invention can obtain the effect of preventing generation of the carbon-containing gas by reaction between the carbon member in the furnace of the pulling machine and SiO that evaporates from the silicon melt and the effect of preventing diffusion of the carbon-containing gas generated by the reaction into the silicon melt side, and, as a result of combination of these effects, can effectively manufacture the single crystal with a carbon concentration lower than that according to the conventional technologies.

BRIEF DESCRIPTION OF DRAWINGS

FIG. 1 is a schematic cross-sectional illustration showing one example of a single crystal manufacturing apparatus according to a first embodiment of the present invention;

FIG. 2 is an enlarged schematic cross-sectional illustration showing a peripheral part of a cooling auxiliary cylinder in the example of the single crystal manufacturing apparatus shown in FIG. 1;

FIG. 3 is an enlarged schematic cross-sectional illustration showing the peripheral part of the cooling auxiliary cylinder in another example of the single crystal manufacturing apparatus according to the first embodiment of the present invention;

FIG. 4 is a schematic cross-sectional illustration showing one example of a single crystal manufacturing apparatus according to a second embodiment of the present invention;

FIG. 5 is an enlarged schematic cross-sectional illustration showing a peripheral part of a rectifying cylinder of the single crystal manufacturing apparatus shown in FIG. 4;

FIG. 6 is an enlarged schematic cross-sectional illustration showing another example of the peripheral part of the rectifying cylinder of the single crystal manufacturing apparatus according to the second embodiment of the present invention;

FIG. 7 is a graph showing solidification ratio dependence of a carbon concentration in a single crystal according to Example 1 and Comparative Example 1;

FIG. 8 is a graph showing solidification ratio dependence of a carbon concentration in a single crystal according to Example 2, Comparative Example 1, and Comparative Example 2;

FIG. 9 is a graph showing solidification ratio dependence of a carbon concentration in a single crystal according to Example 3 and Comparative Example 1;

FIG. 10 is a graph showing solidification ratio dependence of a carbon concentration in a single crystal according to Example 4 and Comparative Example 1;

FIG. 11 is a schematic cross-sectional illustration showing an example of a single crystal manufacturing apparatus according to a CZ method used in Comparative Example 1 and Comparative Example 3;

FIG. 12 is a graph showing solidification ratio dependence of a carbon concentration in a single crystal according to Example 5, Comparative Example 3, and Comparative Example 4;

FIG. 13 is a graph showing solidification ratio dependence of a carbon concentration in a single crystal according to Example 6 and Comparative Example 3;

FIG. 14 is a graph showing solidification ratio dependence of a carbon concentration in a single crystal according to Example 7 and Comparative Example 3.

DESCRIPTION OF EMBODIMENTS

The present invention relates to a manufacturing apparatus for a single crystal, such as a silicon single crystal, which is grown by a Czochralski method (CZ method) or a magnetic field applied Czochralski method (MCZ method).

As described above, the development of the apparatus capable of manufacturing the single crystal with a carbon concentration that is lower than that according to the conventional technologies has been desired.

As a result of earnest examination of the above-mentioned issues, the present inventors have found that, by providing a rectifying cylinder on a thermal shield member so as to enclose a single crystal being pulled up, fitting a cooling auxiliary cylinder to the inside of a cooling cylinder, surrounding a bottom surface of the cooling cylinder, the bottom surface facing a silicon melt, with a first portion of the cooling auxiliary cylinder, and further surrounding an upper end portion of the rectifying cylinder with a second portion of the cooling auxiliary cylinder, it is possible to prevent generation of carbon-containing gas by reaction between a carbon member in a furnace and silicon monoxide (SiO) that evaporates from the silicon melt, and to further prevent diffusion of the carbon-containing gas generated by the above-mentioned reaction into the silicon melt side, and have completed a first embodiment of the present invention based on these findings.

That is, the first embodiment of the present invention is a single crystal manufacturing apparatus for growing a single crystal by using a Czochralski method, the apparatus comprising:

a main chamber comprising a ceiling portion, and housing a crucible for containing a silicon melt;

a pulling chamber provided continuously at an upper portion of the ceiling portion of the main chamber via a gate valve, and configured to contain a silicon single crystal to be pulled up from the silicon melt;

a thermal shield member provided so as to face the silicon melt contained in the crucible;

a rectifying cylinder provided on the thermal shield member so as to enclose the silicon single crystal being pulled up;

a cooling cylinder provided so as to encircle the silicon single crystal being pulled up, comprising an extending portion extending from the ceiling portion of the main chamber toward the silicon melt, and configured to be forcibly cooled by a cooling medium; and a cooling auxiliary cylinder fitted to inside of the cooling cylinder, wherein the extending portion of the cooling cylinder includes a bottom surface facing the silicon melt, and wherein the cooling auxiliary cylinder includes at least a first portion surrounding the bottom surface of the cooling cylinder and a second portion surrounding an upper end portion of the rectifying cylinder.

Should be noted that above-mentioned Patent Literatures 1 and 2 are related to the present technology in terms of paying attention to the carbon concentration in the single crystal, but are technologies that pay attention to contamination by carbon introduced by the raw material silicon, and that are different from the first embodiment of the present invention that pays attention to carbon contamination due to the crystal manufacturing process.

In addition, Patent Literatures 3 to 5 suggest that increasing the linear velocity of inert gas flowing from immediately above the raw material melt in the direction toward the upper end of the quartz crucible by using the rectifying cylinder or the rectifying member, and making the carbon-containing gas generated by reaction between the carbon member in the furnace and SiO that evaporates from the silicon melt hard to back-blow into the raw material melt side, but none of Patent Literatures 3 to 5 describes nor suggests the cooling auxiliary cylinder that includes both the first portion and the second portion, which are included in the single crystal manufacturing apparatus according to the first embodiment of the present invention.

Furthermore, as a result of earnest examination of the above-mentioned issues, the present inventors have found that the single crystal manufacturing apparatus having the configuration of providing the rectifying cylinder on the thermal shield member so as to enclose the single crystal being pulled up, fitting the cooling auxiliary cylinder to the inside of the cooling cylinder, surrounding the lower portion of the cooling auxiliary cylinder, the lower portion being the portion projecting downward from the cooling cylinder, with the upper portion of the rectifying cylinder, can prevent generation of the carbon-containing gas by reaction between the carbon member in the furnace and SiO that evaporates from the silicon melt (raw material melt), and can further prevent diffusion of the carbon-containing gas generated by the above-mentioned reaction into the silicon melt side, and have completed the second embodiment of the present invention based on these findings.

That is, the second embodiment of the present invention is a single crystal manufacturing apparatus for growing a single crystal by using a Czochralski method, the apparatus comprising:

a main chamber comprising a ceiling portion, and housing a crucible for containing a silicon melt;

a pulling chamber provided continuously at an upper portion of the ceiling portion of the main chamber via a gate valve, and configured to contain a silicon single crystal to be pulled up from the silicon melt;

a thermal shield member provided so as to face the silicon melt contained in the crucible;

a rectifying cylinder provided on the thermal shield member so as to enclose the silicon single crystal being pulled up;

a cooling cylinder provided so as to encircle the silicon single crystal being pulled up, comprising an extending portion extending from the ceiling portion of the main chamber toward the silicon melt, and configured to be forcibly cooled by a cooling medium; and a cooling auxiliary cylinder fitted to inside of the cooling cylinder, wherein an upper portion of the rectifying cylinder has a structure of surrounding a lower portion of the cooling auxiliary cylinder, the lower portion being a portion projecting downward from the cooling cylinder.

Note that the technologies described in the above-mentioned Patent Literatures 1 and 2 are related to the present technology in terms of paying attention to the carbon concentration in the single crystal, but are technologies that pay attention to contamination by carbon introduced by the raw material silicon, and that are different from the second embodiment of the present invention that pays attention to carbon contamination due to the crystal manufacturing process.

In addition, Patent Literatures 3 to 5 suggest that increasing the linear velocity of inert gas flowing from immediately above the raw material melt in the direction toward the upper end of the quartz crucible by using the rectifying cylinder or the rectifying member, and making the carbon-containing gas generated by reaction between the carbon member in the furnace and SiO that evaporates from the silicon melt hard to back-blow into the raw material melt side, but none of Patent Literatures 3 to 5 discloses the configuration of providing the rectifying cylinder on the thermal shield member so as to enclose the single crystal being pulled up, fitting the cooling auxiliary cylinder to the inside of the cooling cylinder, and surrounding the lower portion of the cooling auxiliary cylinder, the lower portion being the portion projecting downward from the cooling cylinder, with the upper portion of the rectifying cylinder, according to the second embodiment of the present invention.

The present invention will be described in detail below with reference to the drawings, but is not limited to the description.

[Single Crystal Manufacturing Apparatus According to First Embodiment]

By virtue of use of the single crystal manufacturing apparatus according to the first embodiment having the above-mentioned configuration, it is possible to decrease a temperature of a space around the cooling auxiliary cylinder, and prevent generation of carbon-containing gas by reaction between the carbon member in the furnace of the single crystal manufacturing apparatus and SiO that evaporates from the silicon melt. In addition, by providing the rectifying cylinder on the thermal shield member and adopting the structure of surrounding the upper end portion of the rectifying cylinder with the second portion of the cooling auxiliary cylinder, diffusion of the carbon-containing gas generated by the reaction into the silicon melt side can also be prevented. As a result of combination of these effects, it is possible to effectively manufacture the single crystal with a carbon concentration that is lower than that according to the conventional technologies.

Each member of the single crystal manufacturing apparatus according to the first embodiment of the present invention will be described in more detail below.

(1) Main Chamber

The main chamber includes the ceiling portion, and houses the crucible for containing the silicon melt.

The crucible may be composed of, for example, a quartz crucible for containing the silicon melt and a graphite crucible for supporting the quartz crucible.

Including the above, the main chamber can have a structure that is similar to a structure of a main chamber of a general CZ silicon single crystal manufacturing apparatus.

For example, the main chamber is also capable of housing a heater. The heater is, for example, provided so as to encircle the circumference of the crucible, and capable of melting raw material silicon contained in the crucible into the silicon melt.

In a case where the main chamber includes the heater, the main chamber is also capable of housing a thermal insulator that encircles the heater.

The crucible can be supported by a crucible support. A crucible shaft may be attached to the crucible support. The crucible shaft enables rotation and lifting/lowering of the crucible support and the crucible supported by the crucible support.

(2) Pulling Chamber

The pulling chamber is provided continuously at the upper portion of the ceiling portion of the main chamber via the gate valve, and contains the silicon single crystal to be pulled up from the silicon melt.

Including the above, the pulling chamber can have a structure that is similar to a structure of a pulling chamber of the general CZ silicon single crystal manufacturing apparatus.

(3) Thermal Shield Member

The thermal shield member is provided so as to face the silicon melt contained in the crucible. The thermal shield member is capable of cutting off radiation from the surface of the silicon melt, and keeping the temperature of the surface of the silicon melt high. The thermal shield member can be, for example, provided so as to face the silicon melt in such a shape as that an inner diameter thereof becomes gradually smaller downward.

The thermal shield member, for example, can be housed inside the main chamber.

A material of the thermal shield member is not specifically limited, but the thermal shield member can be made of, for example, graphite.

(4) Rectifying Cylinder

The rectifying cylinder is provided on the thermal shield member so as to enclose the silicon single crystal being pulled up. The rectifying cylinder is capable of enclosing the silicon single crystal being pulled up coaxially with the thermal shield member.

Since an amount of the carbon-containing gas generated by reaction between the carbon member in the furnace and SiO that evaporates from the silicon melt increases in proportion to a surface area of a graphite member in the furnace, the rectifying cylinder is preferably made of quartz or ceramic, and more preferably made of synthetic quartz.

An opening is preferably formed in a side surface of the rectifying cylinder used.

By virtue of using such a rectifying cylinder having the opening in the side surface thereof, the liner velocity of inert gas flowing from the opening of the rectifying cylinder toward the outside of the rectifying cylinder, for example, in a direction toward a monitoring window for monitoring the inside of the furnace in the cylinder portion, which will be described later, is increased, and consequently, it is possible to obtain the effect of making the carbon-containing gas harder to back-flow from the inside of the cylinder portion or the outside of the cylinder portion into the raw material melt side.

In addition, the opening of the rectifying cylinder preferably has a structure in which the upper end of the opening is positioned at a height of 35% or less of the whole height of the rectifying cylinder, and the center of the opening is preferably provided at a height of 30 mm or more and 40 mm or less from the lower end portion of the rectifying cylinder. Openings are preferably formed at regular intervals in a circumferential direction in the side surface of the rectifying cylinder, and can have, for example, a structure of being provided on three axes at angles of 0°, 120°, and 240°. Furthermore, the opening preferably has a structure in which a length from an upper end thereof to a lower end thereof is 50 mm or less, and in which an open region thereof has an area of 15% or less of the whole area of the rectifying cylinder.

With use of such a rectifying cylinder having the opening in the side surface thereof, the liner velocity of inert gas flowing from the opening of the rectifying cylinder in the direction toward the monitoring window for monitoring the inside of the furnace in the cylinder portion, which will be described later, is further increased, and consequently, it is possible to obtain the effect of making the carbon-containing gas more harder to back-flow from the inside of the cylinder portion or the outside of the cylinder portion into the raw material melt side.

A lower limit of the position of the upper end of the opening of the rectifying cylinder is not specifically limited, but the upper end of the opening of the rectifying cylinder can be positioned, for example, at a height of 5% or more of the whole height of the rectifying cylinder.

(5) Cooling Cylinder

The cooling cylinder is provided so as to encircle the silicon single crystal being pulled up, includes an extending portion extending from the ceiling portion of the main chamber toward the silicon melt, and is configured to be forcibly cooled by a cooling medium. The extending portion extending toward the silicon melt includes a bottom surface facing the silicon melt.

The cooling cylinder extends toward the silicon melt, and can be provided inside the main chamber below the gate valve.

The cooling medium that forcibly cools the cooling cylinder is not specifically limited.

(6) Cooling Auxiliary Cylinder

The cooling auxiliary cylinder is fitted to the inside of the cooling cylinder. The cooling auxiliary cylinder includes at least a first portion surrounding the bottom surface of the cooling cylinder and a second portion surrounding the upper end portion of the rectifying cylinder.

The cooling auxiliary cylinder preferably includes at least one selected from the group consisting of a graphite member, a carbon composite member, stainless steel, molybdenum, and tungsten. The first portion of the cooling auxiliary cylinder preferably has a structure of covering the bottom surface facing the silicon melt of the cooling cylinder, and a gap between the first portion of the cooling auxiliary cylinder and the bottom surface of the cooling cylinder is preferably 1.0 mm or less. The gap may be 0 mm (complete contact).

With use of the cooling auxiliary cylinder having such a structure, not only an amount of radiation heat that comes from a high-temperature portion and that is received by the first portion of the cooling auxiliary cylinder covering the bottom surface of the cooling cylinder is increased, but also the cooling auxiliary cylinder is thermally expanded due to the increased temperature of the first portion of the cooling auxiliary cylinder, whereby the gap from the bottom surface of the cooling cylinder can be made smaller and heat conduction to the cooling cylinder can be facilitated. Since the first portion of the cooling auxiliary cylinder covering the bottom surface of the cooling cylinder receives radiation heat from the silicon melt or the high-temperature portion and increases in temperature, and radiation heat emitted from the cooling auxiliary cylinder itself toward the bottom surface of the cooling cylinder increases, it becomes possible to conduct heat to the cooling cylinder even when there is the gap from the bottom surface of the cooling cylinder. This allows radiation heat from the high-temperature portion around the heater or around the thermal shield member to be effectively conducted to the cooling cylinder. As a result, radiation heat from the thermal shield member into the crystal to be grown is decreased, and a crystal growth rate is increased, and at the same time, it is possible to certainly obtain the effect of preventing generation of the carbon-containing gas by reaction between the carbon member in the furnace and SiO that evaporates from the silicon melt.

The second portion of the cooling auxiliary cylinder preferably includes a groove portion covering a region with an area of 10% or more and 35% or less of the whole area of the side surface of the rectifying cylinder.

With use of such a structure, it is possible to more certainly obtain the effect of making the carbon-containing gas present in the region immediately above the silicon melt hard to back-flow into the silicon melt side.

In this case, the gap between each of side surfaces of the upper end portion of the rectifying cylinder and the side surface of the groove portion of the second portion of the cooling auxiliary cylinder is preferably 5 mm or more and 25 mm or less.

With use of such a structure, it is possible to more certainly prevent the carbon-containing gas to back-flow into the silicon melt side.

(7) Others

A structure of a hot zone (HZ) other than the above can be identical to the structure of the general CZ silicon single crystal manufacturing apparatus.

For example, a single crystal manufacturing apparatus using a magnetic field applied Czochralski method (MCZ method) can further include a magnetic field applying apparatus that applies a magnetic field to the silicon melt.

Subsequently, a specific example of the single crystal manufacturing apparatus according to the first embodiment of the present invention is described with reference to the drawings. Note that a description about a part that is identical to that in a conventional apparatus may be omitted as appropriate.

FIG. 1 is a schematic cross-sectional illustration showing one example of the single crystal manufacturing apparatus according to the first embodiment of the present invention. FIG. 2 is an enlarged schematic cross-sectional illustration showing the periphery of the cooling auxiliary cylinder in the example of the single crystal manufacturing apparatus shown in FIG. 1.

The single crystal manufacturing apparatus 1 shown in FIGS. 1 and 2 includes a main chamber 2, a pulling chamber 3, a thermal shield member 12, a rectifying cylinder 14, a cooling cylinder 13, and a cooling auxiliary cylinder 15. The main chamber 2 includes a ceiling portion 21 and houses a quartz crucible 7 for containing a silicon melt 6 and a graphite crucible 8 for supporting the quartz crucible 7. The pulling chamber 3 is continuously provided at the upper portion of the main chamber 2 via a gate valve, which is not shown. The thermal shield member 12 is provided so as to face the silicon melt 6. The rectifying cylinder 14 is provided on the thermal shield member 12. The cooling cylinder 13 includes an extending portion 131 extending from the ceiling portion 21 of the main chamber 2 toward the silicon melt 6. The cooling auxiliary cylinder 15 is fitted to the inside of the cooling cylinder 13.

The main chamber 2 further houses a crucible support 16, a crucible shaft 17, a heater 9, and a thermal insulator 10. The crucible support 16 supports the graphite crucible 8. The crucible shaft 17 supports the crucible support 16. The heater 9 is provided so as to encircle the graphite crucible 8. The thermal insulator 10 is provided so as to encircle the heater 9. The crucible shaft 17 enables rotation of the silicon melt 6, the quartz crucible 7, the graphite crucible 8, and the crucible support 16 about a rotation axis 18 and also enables lifting/lowering of these.

A cylinder portion 11 is provided on the ceiling portion 21 of the main chamber 2. The cylinder portion 11 extends from the ceiling portion 21 toward the silicon melt 6, and the thermal shield member 12 is attached to an end portion of the cylinder portion 11.

The pulling chamber 3 is configured to contain a silicon single crystal 5 pulled up from the silicon melt 6.

The rectifying cylinder 14 includes an upper end portion 141 on the opposite side of the thermal shield member 12. The rectifying cylinder 14 is provided on the thermal shield member 12 so as to enclose the silicon single crystal 5 being pulled up. In the example shown in FIGS. 1 and 2, the rectifying cylinder 14 is provided inside the main chamber 2.

The cooling cylinder 13 is provided so as to encircle the silicon single crystal 5 being pulled up. The portion 131 of the cooling cylinder 13 extends from the ceiling portion 21 of the main chamber 2 toward the silicon melt 6. The portion 131 is provided inside the main chamber 2, and has a bottom surface 132 facing the silicon melt 6. The cooling cylinder 13 further includes a portion 133 that is fitted to the inside of the upper end portion of the main chamber and that extends upward from the ceiling portion 21 of the main chamber 2 positioned immediately below the gate valve, which is not shown. The cooling cylinder 13 is configured to be forcibly cooled by the cooling medium that is supplied from a cooling medium circulation mechanism, which is not shown.

The cooling auxiliary cylinder 15 includes a first portion 151 and a second portion 152. The first portion 151 of the cooling auxiliary cylinder 15 surrounds the bottom surface 132 of the cooling cylinder 13, as shown in FIGS. 1 and 2. More specifically, the first portion 151 of the cooling auxiliary cylinder 15 surrounds the portion 131 including the bottom surface 132 of the cooling cylinder 13 in an up-and-down direction and from one side surface. The first portion 151 of the cooling auxiliary cylinder 15 includes a cover portion 153 that extends in a direction substantially perpendicular to a pulling direction of the silicon single crystal 5, as shown in FIG. 2.

In contrast, the second portion 152 of the cooling auxiliary cylinder 15 surrounds the upper end portion 141 of the rectifying cylinder 14 inside the main chamber 2, as shown in FIGS. 1 and 2. More specifically, the second portion 152 of the cooling auxiliary cylinder includes a groove portion 154 shown in FIG. 2. The groove portion 154 receives the upper end portion 141 of the rectifying cylinder 14, and thereby covers a part of a side surface 142 of the rectifying cylinder 14. The cover 153 of the first portion 151 of the cooling auxiliary cylinder 15 also surrounds the upper end portion 141 of the rectifying cylinder 14. The cover 153 serves as a bottom portion of the groove portion 154 which is part of the second portion 152.

A gap between the first portion 151 (more specifically, the cover portion 153) of the cooling auxiliary cylinder 15 and the bottom surface 132 of the cooling cylinder 13 is indicated as "d" shown in FIG. 2. The gap d is preferably 1.0 mm or less. A ratio of a region covered with the groove portion 154 of the cooling auxiliary cylinder 15 to the whole area of the side surface 142 of the rectifying cylinder 14 is expressed by "(a/b)×100" by using "a" and "b" shown in FIG. 2. The ratio of a/b is preferably 10% or more and 35% or less. A gap between the cooling auxiliary cylinder and the side surface 142 of the rectifying cylinder 14 in the groove portion 154 of the second portion 152 of the cooling auxiliary cylinder 15 is indicated as "c" shown in FIG. 2. The gap c is preferably 5 mm or more and 25 mm or less. Note that the above-mentioned "a" is an average value in the circumferential direction. In contrast, it is preferable that the above-mentioned "b" to "d" be approximately constant values in the whole circumferential direction. Thus, the ratio of a/b is preferably an average value in the circumferential direction.

While the description has been given of the case where there is no opening in the side surface 142 of the rectifying cylinder 14, for example, an opening 143 may be provided in the side surface 142 of the rectifying cylinder 14 as shown in FIG. 3.

By virtue of such a rectifying cylinder 14 having the opening 143 in the side surface 142 as shown in FIG. 3, the flow velocity of inert gas flowing from the opening 143 of the rectifying cylinder 14 in a direction toward a monitoring window for monitoring the inside of the furnace in the cylinder portion 11 is increased, and consequently, it is possible to obtain the effect of making the carbon-containing gas harder to back-flow from the inside of the cylinder portion 11 or from the outside of the cylinder portion 11 to the silicon melt 6 side.

Openings 143 shown in FIG. 3 are formed at regular intervals in the circumferential direction of the side surface 142 of the rectifying cylinder 14.

The openings 143 can be provided, for example, on three axes at angles of 0°, 120°, and 240°. Furthermore, the opening 143 preferably has a structure having a length from the upper end of the opening 143 to the lower end thereof being 50 mm or less, and having an open region with an area of 15% or less of the whole area of the side surface 142 of the rectifying cylinder 14. A ratio of the open region of the opening 143 to the whole area of the side surface 142 of the rectifying cylinder 14 corresponds to a ratio of an opening area "e" shown in FIG. 3 to a whole area "f", that is, a ratio of e/f.

In addition, the opening 143 of the rectifying cylinder 14 preferably has a structure in which the upper end of the opening is positioned at a height of 35% or less of the whole height of the rectifying cylinder 14, and the center of the opening is provided at a height of 30 mm or more and 40 mm or less from the lower end portion of the rectifying cylinder 14.

By virtue of such a rectifying cylinder 14 having the opening 143 in the side surface 142, the flow velocity of inert gas flowing from the opening 143 of the rectifying cylinder 14 in a direction toward the monitoring window for monitoring the inside of the furnace in the cylinder portion 11 is increased, and consequently, it is possible to obtain the effect of making the carbon-containing gas harder to back-flow from the inside of the cylinder portion 11 or from the outside of the cylinder portion 11 to the silicon melt 6 side.

Subsequently, an example of a single crystal manufacturing method using the crystal manufacturing apparatus according to the first embodiment of the present invention is described with reference to FIGS. 1 and 2. However, the single crystal manufacturing apparatus according to the first embodiment of the present invention is not limited to the single crystal manufacturing apparatus shown in FIGS. 1 and 2, and the single crystal manufacturing method using the single crystal manufacturing apparatus according to the first embodiment of the present invention is not limited to what is exemplified below.

First, a seed crystal 4 is immersed in the silicon melt 6 and quietly pulled upward while the seed crystal 4, the quartz crucible 7, and the graphite crucible 8 are caused to rotate about the rotation axis 18 to grow the silicon single crystal 5 having a bar shape. Meanwhile, the quartz crucible 7 and the graphite crucible 8 are lifted in step with crystal growth so that a height of a melt surface is maintained to be constant to obtain a desired diameter and desired crystal quality. The lifting of the quartz crucible 7 and the graphite crucible 8 and the rotation of the quartz crucible 7 and the graphite crucible 8 can be performed by using the crucible shaft 17.

The silicon melt 6 can be obtained by putting raw material silicon into the quartz crucible 7 and melt the raw material silicon using the heater 9.

The raw material silicon used at this time is preferably a semiconductor-grade, high-purity raw material. The first embodiment of the present invention is a technology that adopts the structure of surrounding the bottom surface 132 of the cooling cylinder 13 with the first portion 151 of the cooling auxiliary cylinder 15 and covering the upper end portion 141 of the rectifying cylinder 14 with the second portion 152 so as to reduce carbon concentration due to the crystal manufacturing process. By virtue of a high-purity material, an amount of contamination due to introduction from the material can be reduced and the single crystal with a low carbon concentration can be more certainly manufactured. The raw material silicon used at this time is preferably a semiconductor-grade, high-purity raw material.

With use of one example of the single crystal manufacturing apparatus 1 shown in FIGS. 1 and 2, it is possible to sufficiently transmit radiation heat from the silicon single crystal 5 and radiation heat from the high-temperature portion such as the heater 9 to the cooling cylinder 13, and eliminate the transmitted heat by forced cooling with the cooling medium. Thereby, a silicon single crystal can be effectively manufactured.

In the example of the single crystal manufacturing apparatus 1 shown in FIGS. 1 and 2, it is possible to decrease a temperature of a space around the cooling auxiliary cylinder 15, for example, around the silicon single crystal 5 immediately above the silicon melt, and a temperature of a space enclosed with the cooling auxiliary cylinder 15 and the cylinder portion 11. This can prevent reaction between the carbon member in the manufacturing apparatus 1 and SiO that evaporates from the silicon melt 6, and eventually prevent generation of the carbon-containing gas. In addition, even if the above-mentioned reaction occurs and the carbon-containing gas is generated, the rectifying cylinder 14 in which the upper end portion 141 is surrounded with the second portion 152 of the cooling auxiliary cylinder 15 can prevent the carbon-containing gas from back-flowing into the silicon melt.

That is, by virtue of using the example of the single crystal manufacturing apparatus 1 shown in FIGS. 1 and 2, the single crystal with a low carbon concentration can be effectively manufactured.

Additionally, in the example of the single crystal manufacturing apparatus 1 shown in FIGS. 1 and 2, the rectifying cylinder 14 including the opening 143 in the side surface 142 as shown in FIG. 3 can further prevent the carbon-containing gas from back-flowing into the silicon melt 6 side as described above.

[Single Crystal Manufacturing Apparatus According to Second Embodiment]

By virtue of use of the single crystal manufacturing apparatus having the above-mentioned configuration according to the second embodiment, it is possible to decrease a temperature of a space around the cooling auxiliary cylinder, and prevent generation of the carbon-containing gas by reaction between the carbon member in the furnace and SiO that evaporates from the silicon melt.

In addition, even if the above-mentioned reaction occurs, by providing the rectifying cylinder on the thermal shield member and adopting the structure of surrounding the lower portion of the cooling auxiliary cylinder, the lower portion being the portion projecting downward from the cooling cylinder, it is also possible to prevent diffusion of the carbon-containing gas generated by the above-mentioned reaction into the silicon melt side.

Hence, as a result of combination of these effects, by virtue of the single crystal manufacturing apparatus according to the second embodiment of the present invention, the single crystal with a carbon concentration that is lower than that according to the conventional technologies can be effectively manufactured.

Details of each member of the single crystal manufacturing apparatus according to the second embodiment of the present invention will be described in more detail below.

(1) Main Chamber (2) Pulling Chamber (3) Thermal Shield Member

It should be referred to the description in the first embodiment for details of each of the main chamber, the pulling chamber, and the thermal shield member.

(4) Cooling Cylinder

The cooling cylinder is provided so as to encircle the silicon single crystal being pulled up, includes the extending portion extending from the ceiling portion of the main chamber toward the silicon melt, and is configured to be forcibly cooled by the cooling medium.

The cooling cylinder extends toward the silicon melt, and can be provided inside the main chamber below the gate valve.

The cooling medium that forcibly cools the cooling cylinder is not specifically limited.

(5) Cooling Auxiliary Cylinder

The cooling auxiliary cylinder is fitted to the inside of the cooling cylinder. A material of the cooling auxiliary cylinder used is preferably at least one selected from the group consisting of a graphite member, a carbon composite member, stainless steel, molybdenum, and tungsten. With use of the cooling auxiliary cylinder made of the material having high thermal conductivity and a high emissivity, radiation heat from the high-temperature portion around the heater or around the thermal shield member can be effectively conducted to the cooling cylinder. As a result, radiation heat from a graphite member to a crystal to be grown is decreased to increase a crystal growth rate, and at the same time, it is possible to obtain the effect of further preventing generation of the carbon-containing gas by reaction between the carbon member in the furnace and SiO that evaporates from the silicon melt.

(6) Rectifying Cylinder

The rectifying cylinder in the second embodiment of the present invention is provided on the thermal shield member so as to enclose the silicon single crystal being pulled up. The rectifying cylinder can enclose the silicon single crystal being pulled up coaxially with the thermal shield member.

The rectifying cylinder has the structure of surrounding a lower portion of the cooling auxiliary cylinder, the lower portion being the portion projecting downward from the cooling cylinder, with the upper portion of the rectifying cylinder. Thus, the structure needs to be a structure in which an inner diameter of the rectifying cylinder is larger than an outer diameter of the lower portion of the cooling auxiliary cylinder.

By using the rectifying cylinder provided on the thermal shield member and having the structure in which the upper portion surrounds the lower portion of the cooling auxiliary cylinder, the lower portion being the portion projecting from the cooling cylinder, it is possible to certainly prevent, even if the carbon-containing gas is generated by reaction between the carbon member in the furnace and SiO that evaporates from the silicon melt, diffusion of the carbon-containing gas into the silicon melt side.

Since an amount of the carbon-containing gas generated by reaction between the carbon member in the furnace and SiO that evaporates from the silicon melt increases in proportion to a surface area of the graphite member in the furnace, the rectifying cylinder is preferably made of quartz or ceramic, and more preferably made of synthetic quartz.

The rectifying cylinder used preferably has a structure of surrounding a region having an area of 5% or more of the whole area of the side surface of the portion of the cooling auxiliary cylinder with the upper portion of the rectifying cylinder, the portion of the cooling auxiliary cylinder projecting downward from the cooling cylinder.

With use of such a structure, it is possible to obtain the effect of making the carbon-containing gas harder to back-flow into the silicon melt side.

While an upper limit of a ratio of the region surrounded with the upper portion of the rectifying cylinder to the whole area of the side surface of the portion of the cooling auxiliary cylinder, the portion projecting downward from the cooling cylinder, is not specifically limited, the ratio can be, for example, 60% or less.

It is preferable to adopt a structure in which a clearance between the side surface of the rectifying cylinder and the side surface of the portion of the cooling auxiliary cylinder, the portion projecting downward from the cooling cylinder, is 3 mm or more and less than 15 mm.

With use of such a structure, it is possible to more certainly obtain the effect of making the carbon-containing gas harder to back-flow into the silicon melt side.

The opening is preferably formed in the side surface of the rectifying cylinder used.

With use of such a rectifying cylinder having the opening in the side surface thereof, the liner velocity of inert gas flowing from the opening of the rectifying cylinder toward the outside of the rectifying cylinder, for example, in the direction toward the monitoring window for monitoring the inside of the furnace in the cylinder portion, which will be described later, is increased, and consequently, it is possible to obtain the effect of making the carbon-containing gas harder to back-flow from the inside of the cylinder portion or from the outside of the cylinder portion into the raw material melt side.

In addition, the opening in the rectifying cylinder preferably has a structure in which the upper end of the opening is positioned at a height of 35% or less of the whole height of the rectifying cylinder, and the center of the opening is provided at a position of 30 mm or more and 40 mm or less from the lower end portion of the rectifying cylinder. Openings are preferably formed at regular intervals in the circumferential direction in the side surface of the rectifying cylinder, and can have, for example, a structure of being provided on three axes at angles of 0°, 120°, and 240°. Furthermore, the opening preferably has a structure in which a length from an upper end thereof to a lower end thereof is 50 mm or less, and an open region thereof has an area of 15% or less of the whole area of the rectifying cylinder.

A lower limit of the position of the upper end of the opening of the rectifying cylinder is not specifically limited, but the upper end of the opening of the rectifying cylinder can be positioned, for example, at a height of 5% or more of the whole height of the rectifying cylinder.

With use of such a rectifying cylinder having the opening in the side surface thereof, the flow velocity of inert gas flowing from the opening of the rectifying cylinder in the direction toward, for example, the monitoring window for monitoring the inside of the furnace in the cylinder portion, which will be described later, is further increased, and consequently, it is possible to obtain the effect of making the carbon-containing gas harder to back-flow from the inside of the cylinder portion or from the outside of the cylinder portion to the raw material melt side.

(7) Others

A structure of a HZ other than the above can be identical to the structure of the general CZ silicon single crystal manufacturing apparatus.

For example, the single crystal manufacturing apparatus using the magnetic field applied Czochralski method (MCZ method) can further include the magnetic field applying apparatus that applies a magnetic field to the silicon melt.

Subsequently, a specific example of the single crystal manufacturing apparatus according to the second embodiment of the present invention is described with reference to the drawings. A description about a part that is identical to that in a conventional apparatus may be omitted as appropriate.

FIG. 4 is a schematic cross-sectional illustration showing one example of the single crystal manufacturing apparatus according to the second embodiment of the present invention. FIG. 5 is an enlarged schematic cross-sectional illustration showing the periphery of the rectifying cylinder of the single crystal manufacturing apparatus shown in FIG. 4.

The single crystal manufacturing apparatus 1 shown in FIGS. 4 and 5 includes the main chamber 2, the pulling chamber 3, the cooling cylinder 13, and the cooling auxiliary cylinder 15. The main chamber 2 includes the ceiling portion 21 and houses the quartz crucible 7 for containing the silicon melt 6 and the graphite crucible 8 for supporting the quartz crucible 7. The pulling chamber 3 is continuously provided at the upper portion of the main chamber 2 via the gate valve, which is not shown. The cooling cylinder 13 includes an extending portion 13*a* extending from the ceiling portion 21 of the main chamber 2 toward the silicon melt 6. The cooling auxiliary cylinder 15 is fitted to the inside of the cooling cylinder 13.

As shown in FIG. 5, the cooling auxiliary cylinder includes an extending portion 15*a* extending downward and a portion 15*b* provided on the extending portion 13*a* of the cooling cylinder 13. As shown in FIG. 5, the extending portion 15*a* of the cooling auxiliary cylinder extending downward is positioned inside the extending portion 13*a* of the cooling cylinder 13, and extends downward from the portion 15*b*. A thickness of the extending portion 15*a* is smaller than a thickness of the portion 15*b*.

The main chamber 2 further houses the crucible support 16, the crucible shaft 17, the heater 9, and the thermal insulator 10. The crucible support 16 supports the graphite crucible 8. The crucible shaft 17 supports the crucible support 16. The heater 9 is provided so as to encircle the graphite crucible 8. The thermal insulator 10 is provided so as to encircle the heater 9. The crucible shaft 17 enables the rotation of the silicon melt 6, the quartz crucible 7, the graphite crucible 8, and the crucible support 16 about the rotation axis 18 and also enables the lifting/lowering of these.

The cylinder portion 11 is provided on the ceiling portion 21 of the main chamber 2. The cylinder portion 11 extends from the ceiling portion 21 toward the silicon melt 6, and the thermal shield member 12, which is made of, for example, graphite, is provided at the end portion of the cylinder portion 11 so as to face the silicon melt.

The thermal shield member 12 has such a shape as that an inner diameter thereof gradually becomes smaller downward, is provided so as to face the silicon melt 6, cuts off radiation from the surface of the silicon melt 6, and keeps the temperature of the surface of the silicon melt 6 high.

The rectifying cylinder 14 is provided on the thermal shield member 12 so as to enclose the silicon single crystal to be pulled up coaxially with the thermal shield member 12.

An upper portion 14*a* of the rectifying cylinder 14 has a structure of surrounding a lower portion 15*c* of the cooling auxiliary cylinder 15, as shown in FIG. 5.

As described above, by virtue of use of the cooling auxiliary cylinder 15 and the rectifying cylinder 14 provided on the thermal shield member 12 and having the structure of surrounding the lower portion 15*c* of the cooling auxiliary cylinder 15 with the upper portion 14*a* thereof, it is possible to prevent, even if the carbon-containing gas is generated by reaction between the carbon member in the single crystal manufacturing apparatus 1 and SiO that evaporates from the silicon melt 6, diffusion of the carbon-containing gas into the silicon melt 6 side.

The rectifying cylinder 14 used preferably has a structure of surrounding a region with an area of 5% or more of the whole area of a side surface 15*d* of a portion of the cooling auxiliary cylinder 15, the portion projecting downward from the cooling cylinder 13, with the upper portion 14*a* of the rectifying cylinder 14, and preferably has a structure in which a clearance $c_2$ between a side surface 14*b* of the rectifying cylinder 14 and the side surface 15*d* of the portion of the cooling auxiliary cylinder 15 projecting downward from the cooling cylinder 13 is 3 mm or more and less than 15 mm. By virtue of use of such a structure, it is possible to obtain an effect of making the carbon-containing gas present in the region immediately above the raw material melt 6 and in the neighborhood of the inner surface of the cylinder portion 11 hard to back-flow into the raw material melt side.

The whole area of the side surface 15*d* of the portion of the cooling auxiliary cylinder 15 projecting downward from the cooling cylinder 13 corresponds to a length $b_2$ shown in FIG. 5. The area of the region surrounded (covered) with the upper portion 14*a* of the rectifying cylinder 14 of the side surface 15*d* of the projecting portion of the cooling auxiliary cylinder 15 corresponds to a length $a_2$ shown in FIG. 5. That is, a ratio of $a_2/b_2$ is preferably 5% or more.

In the rectifying cylinder 14 used, as shown in FIG. 6, openings 14*c* are preferably formed in the side surface 14*b* at regular intervals in the circumferential direction, and the rectifying cylinder 14 can have, for example, a structure in which the openings are provided on three axes at angles of 0°, 120°, and 240°. Furthermore, the opening 14*c* preferably has a structure in which a length from an upper end thereof to a lower end thereof is 50 mm or less, and in which an open region thereof has an area of 15% or less of the whole area of the rectifying cylinder 14. In addition, the opening 14*c* of the above-mentioned rectifying cylinder 14 preferably has a structure in which the upper end of the opening is positioned at a height of 35% or less of the whole height of the rectifying cylinder 14, and in which the center of the opening is provided at a height of 30 mm or more and 40 mm or less from the lower end portion of the rectifying cylinder 14. A ratio of the open region of the opening 14*c* to the whole area of the side surface 14*b* of the rectifying cylinder 14 corresponds to a ratio of the area $d_2$ of the opening to the whole area $e_2$, which are shown in FIG. 6, that is, a ratio of $d_2/e_2$.

By virtue of use of such a rectifying cylinder 14 having the opening 14*c* in the side surface 14*b*, the flow velocity of inert gas flowing from the opening 14*c* of the rectifying cylinder 14 in the direction toward the monitoring window for monitoring the inside of the furnace in the cylinder portion 11 is increased, and consequently, it is possible to obtain the effect of making the carbon-containing gas hard to back-flow from the inside of the cylinder portion 11 or from the outside of the cylinder portion 11 to the silicon melt 6 side.

By virtue of use of the above-mentioned rectifying cylinder 14 and cooling auxiliary cylinder 15, it is possible to simultaneously obtain the effect of making the carbon-containing gas present immediately above the silicon melt 6 and on the inside and outside of the cylinder portion 11 hard to back-flow into the silicon melt 6 side and the effect of preventing generation of the carbon-containing gas containing carbon by reaction between the carbon member in the furnace and SiO that evaporates from the silicon melt, and as a result of combination of these effects, it becomes possible to further decrease the carbon concentration in the single crystal.

Subsequently, an example of the single crystal manufacturing method using the crystal manufacturing apparatus according to the present invention is described with reference to FIGS. 4 and 5. However, the single crystal manufacturing apparatus according to the present invention is not limited to the single crystal manufacturing apparatus shown in FIGS. 4 and 5, and the single crystal manufacturing method using the single crystal manufacturing apparatus according to the present invention is not limited to what is exemplified below.

First, the seed crystal 4 is immersed in the silicon melt 6 and quietly pulled upward while the seed crystal 4, the quartz crucible 7, and the graphite crucible 8 are caused to rotate about the rotation axis 18 to grow the silicon single crystal 5 having a bar shape. Meanwhile, the quartz crucible 7 and the graphite crucible 8 are lifted in step with crystal growth so that a height of a melt surface is maintained to be constant to obtain a desired diameter and desired crystal quality. The lifting of the quartz crucible 7 and the graphite crucible 8 and the rotation of the quartz crucible 7 and the graphite crucible 8 can be performed by using the crucible shaft 17.

It is possible to obtain the silicon melt 6 by putting raw material silicon into the quartz crucible 7 and melt the raw material silicon by using the heater 9.

The raw material silicon used is preferably a semiconductor-grade, high-purity raw material. The present invention is a technology that adopts the structure of surrounding the lower portion of the portion of the cooling auxiliary cylinder projecting downward from the cooling cylinder with the rectifying cylinder provided on the thermal shield member to reduce carbon contamination due to the crystal manufacturing process. By virtue of use of the high-purity material, it is possible to reduce an amount of contamination due to introduction of the material and thereby more certainly manufacture the single crystal with a low carbon concentration. Hence, the raw material silicon used is preferably a semiconductor-grade, high-purity raw material.

By virtue of use of one example of the single crystal manufacturing apparatus 1 shown in FIGS. 4 and 5, it is possible to sufficiently transmit radiation heat from the silicon single crystal 5 and radiation heat from the high-temperature portion such as the heater 9 to the cooling cylinder 13, and eliminate the transmitted heat by forced cooling with the cooling medium. This enables more effective manufacturing of the silicon single crystal 5.

In the example of the single crystal manufacturing apparatus 1 shown in FIGS. 4 and 5, it is possible to decrease a temperature of a space around the cooling auxiliary cylinder 15, for example, around the silicon single crystal 5 immediately above the silicon melt 6, and a temperature of a space enclosed with the cooling auxiliary cylinder 15 and the cylinder portion 11. Thereby, reaction between the carbon member in the manufacturing apparatus 1 and SiO that evaporates from the silicon melt 6 can be suppressed, and eventually generation of the carbon-containing gas can be prevented. In addition, even if the above-mentioned reaction occurs and the carbon-containing gas is generated, the rectifying cylinder 14 that is provided on the thermal shield member 12 and whose upper portion 14*a* surrounds the lower portion 15*c* of the cooling auxiliary cylinder 15 can prevent the carbon-containing gas from back-flowing into the silicon melt 6.

That is, by virtue of use of the example of the single crystal manufacturing apparatus 1 shown in FIGS. 4 and 5, it is possible to effectively manufacture the single crystal with a low carbon concentration.

Additionally, in the example of the single crystal manufacturing apparatus 1 shown in FIGS. 4 and 5, by using the rectifying cylinder 14 including the opening 14*c* in the side surface 14*b* as shown in FIG. 6, the carbon-containing gas can be prevented from back-flowing into the silicon melt 6 side as, described above.

EXAMPLES

Hereinafter, the present invention will be specifically described using Examples and Comparative Examples. However, the present invention is not limited to the following Examples.

In each of Examples and Comparative Examples, a single crystal was manufactured on the following common conditions by using a single crystal manufacturing apparatus described below. A crucible with a diameter of 81.28 cm (32 inches) was used. 360 kg of raw material silicon was put into the crucible and melted by a heater, and a silicon melt was obtained. A crystal with a crystal diameter of 300 mm was pulled up while a horizontal magnetic field was applied to the silicon melt. A sample was taken out from the crystal with the diameter of 300 mm after being pulled up at a position of each straight body part, and a carbon concentration was determined in accordance with Photo Luminescence (PL).

Example 1

In Example 1, a single crystal manufacturing apparatus having a structure that is similar to that of the single crystal manufacturing apparatus 1 described with reference to FIGS. 1 and 2 was used. That is, in Example 1, the rectifying cylinder 14 was provided on the thermal shield member 12 so as to enclose the silicon single crystal 5 being pulled up coaxially with the silicon single crystal 5, and the cooling auxiliary cylinder 15 having the structure of covering the upper end portion 141 of the rectifying cylinder 14 with the second portion 152 that is the lower portion of the cooling auxiliary cylinder 15 was used to manufacture the single crystal. Note that a material of the rectifying cylinder 14 at this time was synthetic quartz, and a material used for the cooling auxiliary cylinder 15 was a graphite material having thermal conductivity equal to or more than that of metal and having an emissivity higher than that of the metal. The rectifying cylinder 14 used was a rectifying cylinder having a fully enclosed structure without an opening in a side surface thereof (the ratio of e/f=0% in FIG. 3), as shown in FIGS. 1 and 2.

As shown in FIG. 2, assuming that the ratio between the portion at the upper portion of the rectifying cylinder covered with the cooling auxiliary cylinder, and the whole area of the side surface of the rectifying cylinder was “a/b”, an interval between the side surface of the groove portion at the lower portion of the cooling auxiliary cylinder and the side surface of the rectifying cylinder was “c”, and a gap between the cooling auxiliary cylinder and the bottom surface of the cooling cylinder was “d”, in Example 1, “a/b” was fixed to 35%, “c” was fixed to 5 mm, three levels of d=mm (complete contact), d=1.0 mm, and d=3.0 mm ware provided to manufacture single crystals.

Comparative Example 1

In Comparative Example 1, a single crystal manufacturing apparatus having a structure as shown in FIG. 11 was used. That is, in Comparative Example 1, the single crystal manufacturing apparatus different from the single crystal manufacturing apparatus in Example 1 in that a rectifying cylinder was not mounted onto the thermal shield member 12 and a cooling auxiliary cylinder 115 without the structure of covering the bottom surface 132, which faces the silicon melt 6, of the cooling cylinder 13 was used to manufacture a single crystal.

FIG. 7 shows results on Example 1 and Comparative Example 1. In Example 1 using the single crystal manufacturing apparatus according to the first embodiment of the present invention, it can be seen that the single crystal with a low carbon concentration could be obtained at any solidification ratio in comparison with a case where the manufacturing apparatus according to Comparative Example 1 as shown in FIG. 11 was used to perform manufacturing. Especially in a case where the gap d between the cooling auxiliary cylinder and the bottom surface of the cooling cylinder was 0 mm (complete contact) in Example 1, it was possible to obtain a result indicating that the carbon concentration in the single crystal was decreased by about 89% in comparison with the case where the manufacturing apparatus in Comparative Example 1 was used to perform manufacturing. As can be seen from FIG. 7, it could be confirmed that, when the gap d between the cooling auxiliary cylinder and the bottom surface of the cooling cylinder was 1 mm or less in Example 1, the carbon concentration in the single crystal could be significantly decreased in comparison with Comparative Example 1. Hence, the gap d between the cooling auxiliary cylinder and the bottom surface of the cooling cylinder is preferably 1 mm or less in the manufacturing apparatus used in the first embodiment of the present invention. Meanwhile, even if the gap d between the cooling auxiliary cylinder and the bottom surface of the cooling cylinder was 3 mm in Example 1, it was possible to obtain a result indicating that the carbon concentration in the single crystal was decreased by about 77% in comparison with the case in Comparative Example 1.

Example 2

In Example 2, a single crystal manufacturing apparatus in which “c” was fixed to 5 mm and “d” was fixed to 1.0 mm and that satisfied each of two levels of a/b=10% and a/b=35% was provided to manufacture the single crystal. “a”, “b”, “c” and “d” are shown in FIG. 2. Note that also in Example 2, similarly to Example 1, the rectifying cylinder 14 used was the rectifying cylinder having the fully enclosed structure without the opening in the side surface thereof (the ratio of e/f=0% in FIG. 3), as shown in FIGS. 1 and 2.

Comparative Example 2

In Comparative Example 2, a single crystal manufacturing apparatus similar to that used in Example 2 except for a point that a/b was 0%, that is, the upper end portion 141 of the rectifying cylinder 14 was not surrounded with the second portion 152 of the cooling auxiliary cylinder 15 was used to manufacture the single crystal.

FIG. 8 shows results of Example 2, Comparative Example 1 and Comparative Example 2. In Example 2 using the single crystal manufacturing apparatus according to the first embodiment of the present invention, it can be seen that the single crystal with a low carbon concentration could be obtained at any solidification ratio in comparison with the case where the manufacturing apparatus in Comparative Example 1 as shown in FIG. 11 was used to perform manufacturing. Especially in a case where the ratio of a/b between the area of the portion at the upper end portion 141 of the rectifying cylinder 14 which is covered with the cooling auxiliary cylinder and the whole area of the side surface 142 of the rectifying cylinder 141 was 35% in Example 2, it was possible to obtain a result indicating that the carbon concentration in the single crystal was decreased by about 85% in comparison with the case where the manufacturing apparatus according to Comparative Example 1 was used to perform manufacturing. In addition, as can be seen from FIG. 8, it could be confirmed that, when a/b was 10% or more in Example 2, the carbon concentration in the single crystal could be significantly decreased in comparison with Comparative Examples 1 and 2. Hence, a lower limit value of the ratio between the area of the portion at the upper end portion 141 of the rectifying cylinder 14 covered with the cooling auxiliary cylinder 15 and the whole area of the side surface 142 of the rectifying cylinder 14 in the manufacturing apparatus used in the first embodiment of the present invention is preferably 10%. Meanwhile, in Comparative Example 2 in which a/b was 0%, it was possible to obtain a result indicating that the carbon concentration in the single crystal was decreased by about 67% in comparison with the case in Comparative Example 1, but the result was insufficient in comparison with the result in Example 2.

Note that besides Example 2, the cooling auxiliary cylinder 15 having a structure with a/b being 40% was used to manufacture the single crystal. In Example 2 in which a/b was 35% or less, a field of view for a camera for measurement of a diameter was easily ensured in comparison with a case where a/b was 40%. In consideration of this point, it can be seen that an upper limit of the ratio between the area of the portion at the upper end portion 141 of the rectifying cylinder 14 covered with the cooling auxiliary cylinder 15 and the whole area of the side surface 142 of the rectifying cylinder 14 is preferably 35%.

Example 3

In Example 3, a single crystal manufacturing apparatus in which a/b was fixed to 35% and "d" was fixed to 1.0 mm, and that satisfied each of two levels of c=5 mm and c=25 mm was provided to manufacture the single crystals. Note that also in Example 3, similarly to Example 1, the rectifying cylinder 14 used was the rectifying cylinder having the fully enclosed structure without the opening in the side surface thereof (the ratio of e/f=0% in FIG. 3), as shown in FIGS. 1 and 2.

FIG. 9 shows results in Example 3 and Comparative Example 1. In Example 3 using the single crystal manufacturing apparatus according to the first embodiment of the present invention, it can be seen that the single crystal with a low carbon concentration could be obtained at any solidification ratio in comparison with the case where the single-crystal manufacturing apparatus according to Comparative Example 1 as shown in FIG. 11 was used to perform manufacturing. Especially in a case where an interval c between the side surface of the groove portion 154 of the cooling auxiliary cylinder 15 and the side surface 142 of the rectifying cylinder 14 is 5 mm in Example 3, it was possible to obtain a result indicating that the carbon concentration in the single crystal was decreased by about 85% in comparison with the case where the manufacturing apparatus according to Comparative Example 1 was used to manufacture the single crystal. As can be seen from FIG. 9, it could be confirmed that, when c was 25 mm or less in Example 3, the carbon concentration in the single crystal could be decreased in comparison with Comparative Example 1.

Example 4

Assuming that the ratio of the opening area e of the opening 143 in the side surface 142 of the rectifying cylinder 14 and the whole area f of the side surface 142 of the rectifying cylinder 14 was e/f (shown in FIG. 3), in Example 4, a/b was fixed to 35%, "d" was fixed to 1.0 mm, and "c" was fixed to 5 mm, a single crystal manufacturing apparatus that satisfied each of three levels of e/f=0% (the rectifying cylinder having the fully enclosed structure), e/f=9%, e/f=15% was provided to manufacture single crystals. Note that the rectifying cylinder 14 with e/f=9% or e/f=15% had the structure in which the openings 143 were provided on three axes at angles of 0°, 120°, and 240°.

In addition to the above-mentioned conditions, in the rectifying cylinder 14 with e/f=9%, the upper end of the opening 143 was positioned at a height of 24% of the whole height of the rectifying cylinder 14, and the opening 143 had a structure having an open region with a length of 30 mm from the upper end of the opening 143 to the lower end thereof.

In addition to the above-mentioned conditions, the rectifying cylinder 14 with e/f=15%, the upper end of the opening 143 was positioned at a height of 35% of the whole height of the rectifying cylinder 14, and the opening 143 had a structure having an open region with a length of 50 mm from the upper end of the opening 143 to the lower end thereof.

FIG. 10 shows results in Example 4 and Comparative Example 1. Among Example 4 using the single crystal manufacturing apparatus according to the first embodiment of the present invention, in a case where the ratio of a/b between the opening area e of the opening 143 in the side surface 142 of the rectifying cylinder 14 and the whole area f of the side surface 142 of the rectifying cylinder 14 was 9%, it was possible to obtain a result indicating that the carbon concentration in the single crystal was decreased by about 93% in comparison with Comparative Example 1 in which the manufacturing apparatus having the conventional structure as shown in FIG. 11 was used to manufacture the single crystal. As can be seen from FIG. 10, it could be confirmed that, when e/f was more than 0% and 15% or less in Example 4, the carbon concentration in the single crystal could be significantly decreased in comparison with Comparative Example 1.

Additionally, based on FIG. 10, it could be confirmed that, when the ratio of e/f was 9% or 15%, the carbon concentration in the single crystal was decreased in comparison with the case of e/f=0% (the rectifying cylinder having the fully enclosed structure), that is the carbon concentration in the single crystal was further decreased by the effect of providing the opening in the side surface 142 of the rectifying cylinder 14.

Example 5

In Example 5, a single crystal manufacturing apparatus having a structure that was similar to that of the single crystal manufacturing apparatus 1 described with reference to FIGS. 4 and 5 was used. That is, in Example 5, the rectifying cylinder 14 was provided on the thermal shield member 12 so as to enclose the silicon single crystal 5 being pulled up coaxially with the silicon single crystal 5. In addition, the lower portion **15*c* of the cooling auxiliary cylinder 15 projecting downward from the cooling cylinder 13 was covered and surrounded with the upper portion 14*a* of the rectifying cylinder 14 on the thermal shield member 12. The single crystal manufacturing apparatus 1** having such a rectifying cylinder and such a cooling auxiliary cylinder was used to manufacture single crystals.

Note that a material of the rectifying cylinder 14 at this time was synthetic quartz, and a material used for the cooling auxiliary cylinder 15 was a graphite material having thermal conductivity equal to or more than that of metal and having an emissivity higher than that of the metal.

As shown in FIG. 5, assuming that a ratio between the whole area of the side surface **15*d* of a portion of the cooling auxiliary cylinder 15 projecting downward from the cooling cylinder 13 and the area of a portion of the cooling auxiliary cylinder lower portion 15*c* covered with the rectifying cylinder 14**, was $a_2/b_2$, an interval between the side surface

15*d* of the portion of the cooling auxiliary cylinder 15 projecting downward from the cooling cylinder 13 and the side surface 14*b* of the rectifying cylinder 14 was "$c_2$", a ratio between an opening area $d_2$ of the opening 14*c* in the rectifying cylinder side surface 14*b* and the whole area $e_2$ of the rectifying cylinder side surface 14*b* was "$d_2/e_2$" (shown in FIG. 6), in Example 5, "$c_2$" was fixed to 3 mm, "$d_2/e_2$" was fixed to 0% (fully enclosed structure), and two levels of "$a_2/b_2$"=5% and "$a_2/b_2$"=45% were prepared to manufacture single crystals.

Comparative Example 3

In Comparative Example 3, a single crystal manufacturing apparatus 200 having a structure as shown in FIG. 11 was used. That is, in Comparative Example 3, the single crystal manufacturing apparatus 200, which was different from the single crystal manufacturing apparatus in Example 5 in that a rectifying cylinder was not mounted onto the thermal shield member 12 and only the cooling auxiliary cylinder 15 was used, was used to manufacture a single crystal.

Comparative Example 4

In Comparative Example 4, a single crystal manufacturing apparatus similar to that used in Example except for a point that $a_2/b_2$ was 0%, that is, the lower portion 15*c* of the portion of the cooling auxiliary cylinder 15 projecting downward from the cooling cylinder 13 was not covered with the upper portion 14*a* of the rectifying cylinder 14 was used to manufacture a single crystal.

FIG. 12 shows results of Example 5, Comparative Example 3, and Comparative Example 4. In a case where the ratio of $a_2/b_2$ between the whole area of the side surface 15*b* of the portion of the cooling auxiliary cylinder 15 projecting downward from the cooling cylinder 13 and the area of the portion of the cooling auxiliary cylinder lower portion 15*c* covered with the upper portion 14*a* of the rectifying cylinder 14 was 45% in Example 5 using one example of the single crystal manufacturing apparatus according to the second embodiment of the present invention, it was possible to obtain a result indicating that the carbon concentration in the single crystal was decreased by about 68% in comparison with the case where the manufacturing apparatus in Comparative Example 3 as shown in FIG. 11 was used to perform manufacturing. Additionally, as can be seen from FIG. 12, it could be confirmed that, when $a_2/b_2$ was 5% or more in Example 5, the carbon concentration in the single crystal could be significantly decreased in comparison with Comparative Example 3. Meanwhile, in Comparative Example 4 in which $a_2/b_2$ was 0%, it was possible to obtain a result indicating that the carbon concentration in the single crystal was decreased by about 18% in comparison with the case in Comparative Example 3, but the result was insufficient in comparison with the result in Example 5.

Example 6

In Example 6, $a_2/b_2$ was fixed to 5% and $d_2/e_2$ was fixed to 0% (fully enclosed structure), and two levels of c 2=3 mm and c 2=15 mm were provided to manufacture the single crystal.

FIG. 13 shows results of Example 6 and Comparative Example 3. In a case where the interval $c_2$ between the side surface 15*d* of the portion of the cooling auxiliary cylinder 15 projecting downward from the cooling cylinder 13 and the rectifying cylinder side surface 14*b* was 3 mm in Example 6 using one example of the single crystal manufacturing apparatus according to the second embodiment of the present invention, it was possible to obtain a result indicating that the carbon concentration in the single crystal was decreased by about 58% in comparison with the case where the manufacturing apparatus according to Comparative Example 3 was used to perform manufacturing. Additionally, as can be seen from FIG. 13, it could be confirmed that, when the interval $c_2$ was 15 mm or less in Example 6, the carbon concentration in the single crystal could be significantly decreased in comparison with Comparative Example 3. It can be seen from these results that, when the interval $c_2$ was 15 mm or less in Example 6, a lower carbon concentration could be achieved.

Note that besides Example 6, the rectifying cylinder 14 with $c_2$ being 2 mm was used to manufacture the single crystal. In Example 6 in which the interval $c_2$ was 3 mm or more, there was little interference between the rectifying cylinder 14 and the lower portion of the cooling auxiliary cylinder 15 at the time of setting the rectifying cylinder 14 in comparison with the case where the interval $c_2$ was 2 mm, and it was possible to easily continue an operation. Hence, it can be seen that a lower limit value of the interval between the side surface 15*b* of the portion of the cooling auxiliary cylinder 15 projecting downward from the cooling cylinder 13 and the rectifying cylinder side surface 14*b* is preferably 3 mm.

Example 7

In Example 7, $a_2/b_2$ was fixed to 5%, "$c_2$" was fixed to 3 mm, and three levels of $d_2/e_2$=0%, $d_2/e_2$=9%, and $d_2/e_2$=15% shown in FIG. 6 were provided to manufacture the single crystal. Note that the rectifying cylinder 14 with $d_2/e_2$=9% or $d_2/e_2$=15% had the structure in which openings 14*c* were provided on three axes at angles of 0°, 120°, and 240°.

In addition to the above-mentioned conditions, in the rectifying cylinder with $d_2/e_2$=9%, the upper end of the opening 14*c* was positioned at a height of 24% of the whole height of the rectifying cylinder 14, and the opening 14*c* had a structure having an open region with a length of 30 mm from the upper end of the opening 14*c* to the lower end thereof.

In addition to the above-mentioned conditions, the rectifying cylinder with $d_2/e_2$=15%, the upper end of the opening 14*c* was positioned at a height of 35% of the whole height of the rectifying cylinder 14, and the opening 14*c* had a structure having an open region with a length of 50 mm from the upper end of the opening 14*c* to the lower end thereof.

FIG. 14 shows results of Example 7 and Comparative Example 3. In a case where $d_2/e_2$ was 9% and the upper end of the opening 14*c* was positioned at a height of 24% of the whole height of the rectifying cylinder 14 in Example 7 using one example of the single crystal manufacturing apparatus according to the second embodiment of the present invention, it was possible to obtain a result indicating that the carbon concentration in the single crystal was decreased by about 76% in comparison with the case where the manufacturing apparatus in Comparative Example 3 as shown in FIG. 11 was used to perform manufacturing. Additionally, as shown from FIG. 14, it could be confirmed that, in a case where $d_2/e_2$ was 15% or less and the upper end of the opening 14*c* was positioned at a height of 35% or less of the whole height of the rectifying cylinder 14 in Example 7, the carbon concentration in the single crystal could be significantly decreased in comparison with Comparative Example 3.

Additionally, it can be seen from these results that by setting the ratio of $d_2/e_2$ at 15% or less and positioning the upper end of the opening 14*c* at the height of 35% or less of the whole height of the rectifying cylinder 14 in Example 7, a lower carbon concentration could be achieved. It can be thought that this is because by setting the ratio of $d_2/e_2$ at 15% or less and positioning the upper end of the opening 14*c* at the height of 35% or less of the whole height of the rectifying cylinder 14 in Example 7, the flow velocity of inert gas flowing from the opening 14*c* of the rectifying cylinder 14 in the direction toward the monitoring window for monitoring the inside of the furnace in the cylinder portion 11 was increased, a phenomenon that the carbon-containing gas present inside the cylinder portion 11 back-flows into the raw material melt 6 side was prevented, and, consequently, a carbon concentration in the single crystal could be further decreased. That is, it can be seen from the results of Example 7 that, in the single crystal manufacturing apparatus 1 according to the present invention, setting the ratio of d/e between the opening area d of the opening 14*c* in the rectifying cylinder side surface 14*b* and the whole area e of the rectifying cylinder side surface 14*b* at 15% or less and positioning the upper end of the opening 14*c* at the height of 35% or less of the whole height of the rectifying cylinder 14 can sufficiently maintain the flow velocity of inert gas flowing from the opening 14*c* of the rectifying cylinder 14 in the direction toward the monitoring window for monitoring the inside of the furnace in the cylinder portion 11, which is preferable.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A single crystal manufacturing apparatus for growing a single crystal by using a Czochralski method, the apparatus comprising:

a main chamber comprising a ceiling portion, and housing a crucible for containing a silicon melt;

a pulling chamber provided continuously at an upper portion of the ceiling portion of the main chamber via a gate valve, and configured to contain a silicon single crystal to be pulled up from the silicon melt;

a thermal shield member provided so as to face the silicon melt contained in the crucible;

a rectifying cylinder provided on the thermal shield member so as to enclose the silicon single crystal being pulled up;

a cooling cylinder provided so as to encircle the silicon single crystal being pulled up, comprising an extending portion extending from the ceiling portion of the main chamber toward the silicon melt, and configured to be forcibly cooled by a cooling medium; and a cooling auxiliary cylinder fitted to inside of the cooling cylinder, wherein the extending portion of the cooling cylinder includes a bottom surface facing the silicon melt, and wherein the cooling auxiliary cylinder includes at least a first portion surrounding the bottom surface of the cooling cylinder and a second portion surrounding an upper end portion of the rectifying cylinder.

2. The single crystal manufacturing apparatus according to claim 1, wherein the rectifying cylinder is made of synthetic quartz.

3. The single crystal manufacturing apparatus according to claim 1, wherein the cooling auxiliary cylinder includes at least one selected from the group consisting of a graphite member, a carbon composite member, stainless steel, molybdenum, and tungsten, and wherein the first portion of the cooling auxiliary cylinder has a structure of covering the bottom surface of the cooling cylinder, and a gap between the first portion of the cooling auxiliary cylinder and the bottom surface of the cooling cylinder is 1.0 mm or less.

4. The single crystal manufacturing apparatus according to claim 1, wherein the second portion of the cooling auxiliary cylinder includes a groove portion covering a region having an area of 10% or more and 35% or less of a whole area of a side surface of the rectifying cylinder.

5. The single crystal manufacturing apparatus according to claim 4, wherein a clearance between each of side surfaces of the upper end portion of the rectifying cylinder and a side surface of the groove portion of the second portion of the cooling auxiliary cylinder is 5 mm or more and 25 mm or less.

6. The single crystal manufacturing apparatus according to claim 1, wherein the rectifying cylinder includes an opening in a side surface thereof, and the opening of the rectifying cylinder is formed at such a position as that a height of an upper end of the opening of the rectifying cylinder is 35% or less of a whole height of the rectifying cylinder.

7. A single crystal manufacturing apparatus for growing a single crystal by using a Czochralski method, the apparatus comprising:

a main chamber comprising a ceiling portion, and housing a crucible for containing a silicon melt;

a pulling chamber provided continuously at an upper portion of the ceiling portion of the main chamber via a gate valve, and configured to contain a silicon single crystal to be pulled up from the silicon melt;

a thermal shield member provided so as to face the silicon melt contained in the crucible;

a rectifying cylinder provided on the thermal shield member so as to enclose the silicon single crystal being pulled up;

a cooling cylinder provided so as to encircle the silicon single crystal being pulled up, comprising an extending portion extending from the ceiling portion of the main chamber toward the silicon melt, and configured to be forcibly cooled by a cooling medium; and a cooling auxiliary cylinder fitted to inside of the cooling cylinder, wherein an upper portion of the rectifying cylinder has a structure of surrounding a lower portion of the cooling auxiliary cylinder, the lower portion being a portion projecting downward from the cooling cylinder, and wherein the rectifying cylinder includes an opening in a side surface thereof, and the opening of the rectifying cylinder is formed at such a position as that a height of an upper end of the opening of the rectifying cylinder is 35% or less of a whole height of the rectifying cylinder.

8. The single crystal manufacturing apparatus according to claim 7, wherein the rectifying cylinder is made of synthetic quartz.

9. The single crystal manufacturing apparatus according to claim 7, wherein a material of the cooling auxiliary cylinder is at least one selected from the group consisting of a graphite member, a carbon composite member, stainless steel, molybdenum, and tungsten.

10. The single crystal manufacturing apparatus according to claim 7, wherein the rectifying cylinder has a structure of surrounding a region having an area of 5% or more of a whole area of a side surface of the portion of the cooling auxiliary cylinder projecting downward from the cooling cylinder with an upper portion of the rectifying cylinder.

11. The single crystal manufacturing apparatus according to claim 7, wherein a clearance between a side surface of the rectifying cylinder and a side surface of the portion of the cooling auxiliary cylinder, the portion projecting downward from the cooling cylinder, is 3 mm or more and less than 15 mm.

* * * * *